US010910415B2

(12) United States Patent
Ahn et al.

(10) Patent No.: US 10,910,415 B2
(45) Date of Patent: Feb. 2, 2021

(54) THREE-DIMENSIONAL PHOTODETECTOR AND METHOD OF MANUFACTURING THE SAME

(71) Applicant: INDUSTRY-ACADEMIC COOPERATION FOUNDATION, YONSEI UNIVERSITY, Seoul (KR)

(72) Inventors: Jong Hyun Ahn, Seoul (KR); Won Ho Lee, Seoul (KR); Yong Jun Lee, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 156 days.

(21) Appl. No.: 16/234,967

(22) Filed: Dec. 28, 2018

(65) Prior Publication Data
US 2020/0212080 A1    Jul. 2, 2020

(51) Int. Cl.
*H01L 27/144* (2006.01)
*H01L 31/0352* (2006.01)
(Continued)

(52) U.S. Cl.
CPC ........ *H01L 27/1446* (2013.01); *H01L 27/146* (2013.01); *H01L 31/0216* (2013.01); *H01L 31/0224* (2013.01); *H01L 31/032* (2013.01); *H01L 31/0352* (2013.01); *H01L 31/03926* (2013.01); *H01L 31/08* (2013.01); *H01L 31/18* (2013.01)

(58) Field of Classification Search
CPC ... H01L 27/146; H01L 27/1446; H01L 31/08; H01L 31/0352; H01L 31/03926

USPC .................................. 257/21, 53, 184, 222
See application file for complete search history.

(56) References Cited

FOREIGN PATENT DOCUMENTS

| CN | 105043537 B | 10/2018 |
|---|---|---|
| JP | 2006-114634 A | 4/2006 |

(Continued)

OTHER PUBLICATIONS

Wonho Lee, et al., "Two-dimensional materials in functional three-dimensional architectures with applications in photodetection and imaging", Nature Communications 9, 2018, Article No. 1417, 10 pages.

(Continued)

*Primary Examiner* — David Vu
*Assistant Examiner* — Brandon C Fox
(74) *Attorney, Agent, or Firm* — Sughrue Mion, PLLC

(57) ABSTRACT

The present disclosure discloses a three-dimensional photodetector and a method of manufacturing the same. The three-dimensional photodetector according to an embodiment of the present disclosure includes a base part formed in the center region of the three-dimensional photodetector; a first bending part formed around the base part; at least one branch part connected to the base part through the first bending part; second bending parts formed on the at least one branch part; bonding parts connected to the at least one branch part through the second bending parts; at least one photoresistor formed on the surface of at least one of the base part and the branch parts; and a stretchable substrate to which the bonding parts are attached, wherein the bonding parts are attached to the stretchable substrate so that the base part has a gap in the thickness direction of the stretchable substrate; and the at least one photoresistor is responsible for tracking the traveling direction of light.

22 Claims, 29 Drawing Sheets

(51) Int. Cl.
  *H01L 31/08*   (2006.01)
  *H01L 31/0216*  (2014.01)
  *H01L 31/0224*  (2006.01)
  *H01L 31/18*   (2006.01)
  *H01L 31/0392*  (2006.01)
  *H01L 31/032*  (2006.01)
  *H01L 27/146*  (2006.01)

(56) References Cited

FOREIGN PATENT DOCUMENTS

| | | |
|---|---|---|
| KR | 10-1079919 B1 | 11/2011 |
| KR | 10-1430650 B1 | 8/2014 |
| KR | 10-1515119 B1 | 4/2015 |

OTHER PUBLICATIONS

Communication dated Aug. 19, 2020 by the Korean Patent Office in application No. 10-2019-0008733.

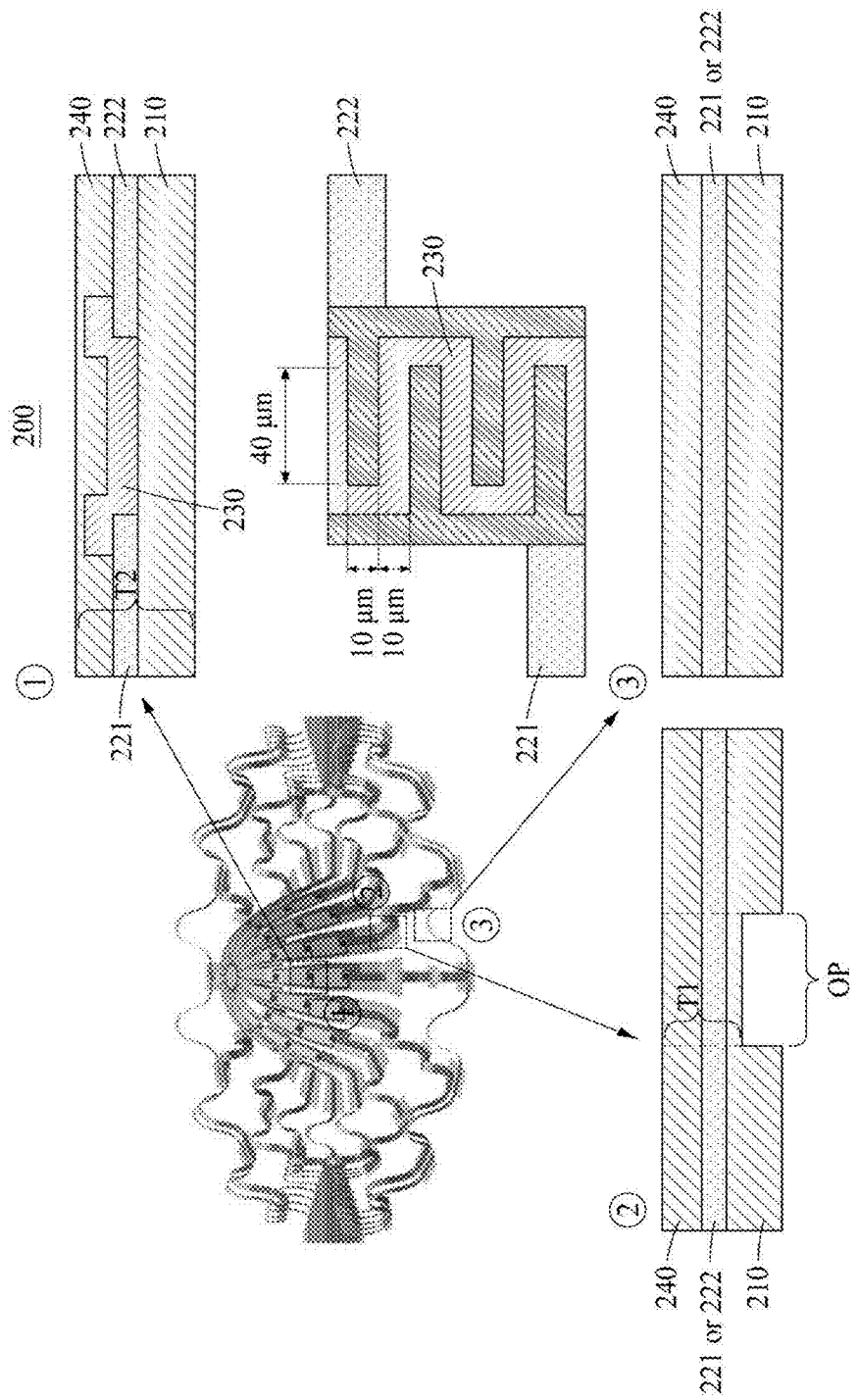

| $\varepsilon_{pre}$~38%, $w_l=2w_0$ | $\varepsilon_{pre}$~111%, $w_l=w_0$ |
| h~1.1mm, $\psi$~60° | h~1.25mm, $\psi$~90° |

Tensile strain : 0%, Height : 1.4 mm

Tensile strain : 20%, Height : 1.0 mm

Tensile strain : 0%, Height : 1.4 mm

Tensile strain : 30%, Height : 0.7 mm

THREE-DIMENSIONAL PHOTODETECTOR AND METHOD OF MANUFACTURING THE SAME

BACKGROUND OF THE DISCLOSURE

Field of the Disclosure

The present disclosure relates to a three-dimensional photodetector and a method of manufacturing the same, and more particularly, to a three-dimensional photodetector capable of tracking the traveling direction of light having a three-dimensional structure to which two-dimensional materials are applied and a method of manufacturing the three-dimensional photodetector.

Description of the Related Art

A photodetector is a device that converts an optical signal into an electrical signal, and is used in various industries such as high-speed and large-capacity optical communication systems, image processing systems, and medical instruments.

Conventionally, a photodetector is manufactured in a two-dimensional structure, wherein a plane structure is formed on a substrate. However, the conventional photodetector having a two-dimensional structure has limitations in measuring the direction and divergence angle of light. Therefore, to overcome the limitations of the conventional photodetector, there is demand for a technique of manufacturing a photodetector having a three-dimensional structure instead of a two-dimensional structure or a photodetector to which two-dimensional materials having a thin thickness and high transmittance are applied.

In accordance with this need, a technique of manufacturing a photodetection structure having a three-dimensional shape has been studied. The photodetection structure having a three-dimensional shape satisfies morphological requirements, but cannot be used as an electronic device due to lack of functional aspects. Therefore, there is need for a method of manufacturing a photodetector having a three-dimensional structure integrated with various functional materials.

In addition, the conventional photodetection structure having a three-dimensional shape is manufactured using inorganic or organic materials. However, damage or deterioration of inorganic or organic materials may be caused by mechanical strain generated during manufacture of the three-dimensional structure. In particular, since it is difficult to apply photolithography to organic materials, there is a problem that an additional process is required.

Therefore, it is necessary to study a photodetector having a three-dimensional structure that can be applied as an electronic device without integrating various functional materials. Further, there is demand for research on a technique of manufacturing a photodetector which can be subjected to a transfer process and has excellent mechanical characteristics and transparency.

RELATED DOCUMENTS

Patent Documents

Korean Patent No. 10-1515119, "PHOTODETECTOR AND METHOD OF MANUFACTURING THE SAME"
Korean Patent No. 10-1430650, "PHOTODETECTOR"
Korean Patent No. 10-1079919, "SEMICONDUCTOR PHOTODETECTOR AND METHOD OF MANUFACTURING THE SAME"

SUMMARY OF THE DISCLOSURE

Therefore, the present disclosure has been made in view of the above problems, and it is an object of the present disclosure to provide a three-dimensional photodetector that includes at least one photoresistor and is capable of tracking the traveling direction of light.

It is another object of the present disclosure to provide at least one photoresistor manufactured using a two-dimensional transition metal chalcogen compound and graphene, wherein, when the photoresistors are included in a three-dimensional photodetector, the stability of the three-dimensional photodetector to external strain may be improved.

It is another object of the present disclosure to provide a method of manufacturing a three-dimensional photodetector, in which a two-dimensional photodetection structure is self-assembled into a three-dimensional structure using a stretchable substrate.

It is yet another object of the present disclosure to provide a method of manufacturing at least one photoresistor using a two-dimensional transition metal chalcogen compound and graphene through a conventional photolithography process.

In accordance with the present disclosure, the above and other objects can be accomplished by the provision of a three-dimensional photodetector including a base part formed in the center region of the three-dimensional photodetector; a first bending part formed around the base part; at least one branch part connected to the base part through the first bending part; second bending parts formed on the at least one branch part; bonding parts connected to the at least one branch part through the second bending parts; at least one photoresistor formed on the surface of at least one of the base part and the branch parts; and a stretchable substrate to which the bonding parts are attached, wherein the bonding parts are attached to the stretchable substrate so that the base part has a gap in the thickness direction of the stretchable substrate; and the at least one photoresistor is responsible for tracking the traveling direction of light.

The at least one photoresistor may track the traveling direction of incident light by detecting an entry point through which the incident light enters the three-dimensional photodetector and an exit point through which the incident light exits the three-dimensional photodetector.

The three-dimensional photodetector may detect a divergence angle of light.

The three-dimensional photodetector may detect intensity of light.

The photoresistor may include a first electrode and a second electrode, which are formed on a first base material and spaced apart from each other; a two-dimensional transition metal chalcogen compound (2D transition metal dichalcogenides) channel formed on the first base material and disposed between the first electrode and the second electrode; and a second base material formed on the first base material on which the first electrode, the second electrode, and the two-dimensional transition metal chalcogen compound channel are formed.

The photoresistor may further include a first protective layer formed on the surface of the first base material on which the two-dimensional transition metal chalcogen compound channel is formed.

The photoresistor may further include a second protective layer formed on the surface of the second base material in contact with the two-dimensional transition metal chalcogen compound channel.

The two-dimensional transition metal chalcogen compound channel may include at least one of molybdenum disulfide ($MoS_2$), molybdenum diselenide ($MoSe_2$), tungsten disulfide ($WS_2$), tungsten diselenide ($WSe_2$), tungsten ditelluride ($WTe_2$), molybdenum ditelluride ($MoTe_2$), tin diselenide ($SnSe_2$), zirconium disulfide ($ZrS_2$), zirconium diselenide ($ZrSe_2$), hafnium disulfide ($HfS_2$), hafnium diselenide ($HfSe_2$), niobium diselenide ($NbSe_2$), and rhenium diselenide ($ReSe_2$).

The first electrode or the second electrode may include graphene.

The first base material or the second base material may be formed of a transparent polymer.

The first protective layer or the second protective layer may include at least one of aluminum oxide ($Al_2O_3$), silicon oxide ($SiO_2$), silicon oxynitride (SiON), hafnium oxide (HfOx), zirconium oxide ($ZrO_2$), magnesium oxide (MgO), titanium oxide ($TiO_2$), zinc oxide (ZnO), tungsten oxide ($WO_3$), tantalum oxide ($Ta_2O_5$), niobium oxide ($Nb_2O_5$), yttrium oxide ($Y_2O_3$), cerium oxide ($CeO_2$), lanthanum oxide ($La_2O_3$), erbium oxide ($Er_2O_3$), hafnium aluminum oxide (HfAlO), hafnium silicon oxide (HfSiO), zirconium silicon oxide (ZrSiO), zirconium aluminum oxide (ZrAlO), hafnium oxynitride (HfON), hafnium silicon oxynitride (HfSiON), silicon nitride ($SiN_x$), silicon boron nitride (SiBN), and hexagonal-boron nitride (h-BN), without being limited thereto. A pattern and thickness adjustable material may be used as the first or second protective layer.

The photoresistor may include a first electrode and a second electrode, which are formed on a first base material and spaced apart from each other; a p-type two-dimensional transition metal chalcogen compound and an n-type two-dimensional transition metal chalcogen compound, which are formed on the first base material and disposed between the first electrode and the second electrode; and a second base material formed on the first base material on which the first electrode, the second electrode, the p-type two-dimensional transition metal chalcogen compound, and the n-type two-dimensional transition metal chalcogen compound are formed.

The photoresistor may have a hetero P-N junction structure or a homo P-N junction structure.

The thickness of the first bending part and the thickness of the second bending part are each thinner than the thickness of the base part or the thickness of the branch parts.

In accordance with an aspect of the present disclosure, the above and other objects can be accomplished by the provision of a method of manufacturing a three-dimensional photodetector includes a step of coating a support substrate with a first base material; a step of patterning the first base material so that patterns corresponding to each of a base part, a first bending part, at least one branch part, second bending parts, and bonding parts are formed on the first base material; a step of forming at least one photoresistor on the surface of at least one of the base part and the branch parts of the patterned first base material; a step of forming a second base material on the patterned first base material including the at least one photoresistor; a step of separating the support substrate from the first base material; a step of forming opening portions on at least one of the first base material and the second base material, which correspond to the first bending part and the second bending parts, and obtaining a two-dimensional photodetection structure; a step of stretching a stretchable substrate so that the stretchable substrate is in a stretched state; a step of attaching the two-dimensional photodetection structure to the stretchable substrate in a stretched state; a step of weakening a bonding force between the stretchable substrate and the base part and a bonding force between the stretchable substrate and the branch parts; and a step of releasing the stretched state of the stretchable substrate to self-assemble the two-dimensional photodetection structure into a three-dimensional structure.

The step of forming at least one photoresistor may include a step of forming a first electrode and a second electrode on the surface of at least one of the base part and the branch parts of the patterned first base material, so that the first and second electrodes are spaced apart from each other; a step of forming a two-dimensional transition metal chalcogen compound channel on the surface of at least one of the base part and the branch parts of the patterned first base material, wherein the two-dimensional transition metal chalcogen compound channel is disposed between the first electrode and the second electrode; and a step of forming the second base material on the patterned first base material on which the first electrode, the second electrode, and the two-dimensional transition metal chalcogen compound channel are formed.

The step of forming at least one photoresistor may further include a step of forming a first protective layer on the patterned first base material.

The step of forming a second base material may further include a step of forming a second protective layer on the patterned first base material on which the first electrode, the second electrode, and the two-dimensional transition metal chalcogen compound channel are formed.

The step of forming opening portions on at least one of the first base material and the second base material and obtaining a two-dimensional photodetection structure may further includes a step of applying photoresists (PRs) to the opening portions.

The step of forming opening portions on at least one of the first base material and the second base material and obtaining a two-dimensional photodetection structure may further include a step of forming photoresists on the surface of the two-dimensional photodetection structure, which corresponds to at least one of the base part, the first bending part, the branch parts, and the second bending parts of the two-dimensional photodetection structure.

The step of obtaining a two-dimensional photodetection structure may further include a step of performing first ultraviolet light/ozone ($UV/O_3$) treatment on the two-dimensional photodetection structure.

The step of stretching a stretchable substrate so that the stretchable substrate is in a stretched state may further include a step of performing second ultraviolet light/ozone ($UV/O_3$) treatment on the stretchable substrate.

BRIEF DESCRIPTION OF THE DRAWINGS

The above and other objects, features and other advantages of the present disclosure will be more clearly understood from the following detailed description taken in conjunction with the accompanying drawings, in which:

FIG. 2A shows a three-dimensional view of a three-dimensional photodetector according to an embodiment of the present disclosure and cross-sectional views of a photoresistor included in the three-dimensional photodetector;

DETAILED DESCRIPTION OF THE DISCLOSURE

Figure 1:
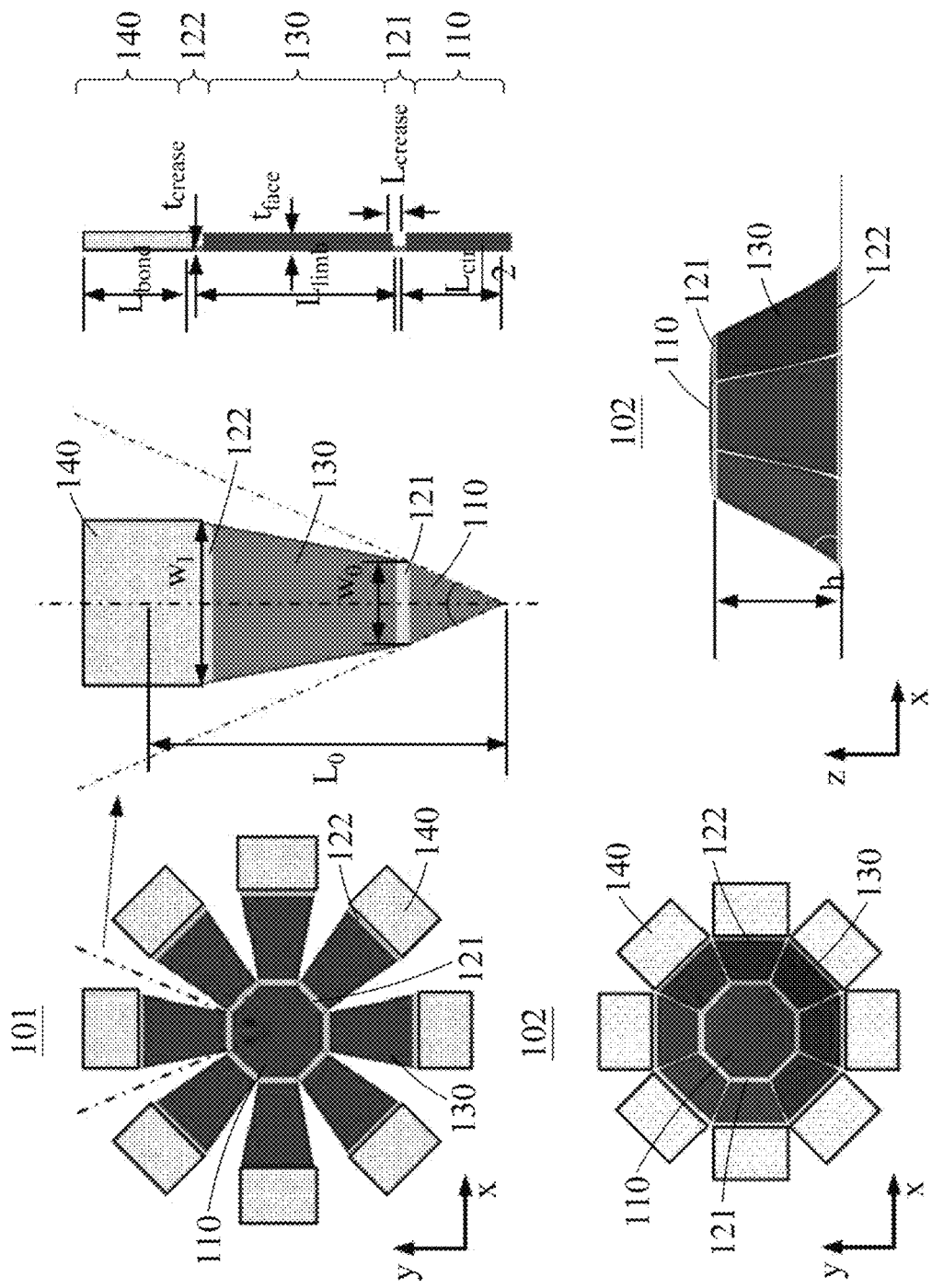
FIG. 1 shows the two-dimensional photodetection structure of a three-dimensional photodetector according to an embodiment of the present disclosure and a top view and a side view of a three-dimensional photodetector according to an embodiment of the present disclosure.

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, a three-dimensional photodetector according to an embodiment of the present disclosure will be described with reference to FIG. 1.

FIG. 1 shows the two-dimensional photodetection structure of a three-dimensional photodetector according to an embodiment of the present disclosure and a top view and a side view of a three-dimensional photodetector according to an embodiment of the present disclosure.

The three-dimensional photodetector according to an embodiment of the present disclosure includes a base part 110 formed in the central region of the three-dimensional photodetector, a first bending part 121 formed around the base part 110, at least one branch part 130 connected to the base part 110 through the first bending part 121, second bending parts 122 formed on the at least one branch part 130, and bonding parts 140 connected to the at least one branch part 130 through the second bending parts 122.

In addition, the three-dimensional photodetector according to an embodiment of the present disclosure includes at least one photoresistor formed on the surface of at least one of the base part 110 and the branch parts 130 and a stretchable substrate to which the bonding parts 140 are attached, wherein the bonding parts 140 are attached to the stretchable substrate so that the base part 110 has a gap in the thickness direction of the stretchable substrate.

In addition, the at least one photoresistor included in the three-dimensional photodetector according to an embodiment of the present disclosure is capable of tracking the traveling direction of light.

Preferably, the at least one photoresistor included in the three-dimensional photodetector according to an embodiment of the present disclosure may track the traveling direction of incident light by detecting an entry point through which the incident light enters the three-dimensional photodetector and an exit point through which the incident light passing through the three-dimensional photodetector exits the three-dimensional photodetector.

More specifically, since the three-dimensional photodetector according to an embodiment of the present disclosure has a high transmittance and is formed in a three-dimensional structure, incident light may pass through the three-dimensional photodetector and exit the three-dimensional photodetector.

Therefore, when incident light enters the three-dimensional photodetector according to an embodiment of the present disclosure, at least one photoresistor formed at an entry point through which incident light enters the three-dimensional photodetector may detect the entry point of the incident light. When incident light passes through the three-dimensional photodetector and exits the three-dimensional photodetector, at least one photoresistor formed at an exit point through which incident light exits the three-dimensional photodetector may detect the exit point of the incident light. By detecting the entry point and exit point of incident light, the three-dimensional photodetector may track the traveling direction of incident light and measure a divergence angle of light.

In addition, since the three-dimensional photodetector according to an embodiment of the present disclosure includes the photoresistor including electrodes manufactured using graphene as a two-dimensional material having a high light transmittance and including a channel manufactured using a two-dimensional transition metal chalcogen compound, light may pass through the at least one photoresistor of the three-dimensional photodetector, so that the entry point and exit point of light may be easily detected and the direction or divergence angle of light may be measured.

In addition, according to the three-dimensional photodetector according to an embodiment of the present disclosure, the intensity of incident light incident on the three-dimensional photodetector may be measured using at least one photoresistor formed on the surface of at least one of the base part 110 and the branch parts 130.

Therefore, the three-dimensional photodetector according to an embodiment of the present disclosure may be used in solar tracking devices, laser radars, or emerging optoelectronic technologies.

Hereinafter, a method of manufacturing a three-dimensional photodetector according to an embodiment of the present disclosure will be described in detail.

The method of manufacturing a three-dimensional photodetector according to an embodiment of the present disclosure includes a step of coating a support substrate with a first base material.

The support substrate serves to support the first base material. Any material can be used as the support substrate so long as the material is capable of supporting the first base material, and silicon/silicon oxide ($Si/SiO_2$) is preferably used as the support substrate.

A transparent polymer may be used as the first base material. For example, the transparent polymer may include at least one of SU-8, a photoresist, polyethylene terephthalate (PET), polyethylene naphthalate (PEN), polyether sulfone (PES), polyimide (PI), polyarylate (PAR), polycarbonate (PC), cycloolefin copolymer (COC), a UV curing resin, and a thermosetting resin.

Preferably, a photoresist or SU-8 is used as the first base material. More preferably, SU-8 is used as the first base material. SU-8 is an epoxy-based negative photoresist, and a negative photoresist refers to a resist in which a portion not irradiated with light is removed by development at the time of exposure.

When SU-8 is used as the first base material included in the three-dimensional photodetector according to an embodiment of the present disclosure, the thickness of the first base material may be easily adjusted. By adjusting the thickness of the first base material corresponding to the first bending part 121 and the second bending parts 122, when strain is applied, the three-dimensional photodetector may be easily self-assembled (similar to origami) without physical damage such as cracks.

The first base material may be formed by at least one of blade coating, bar coating, spray coating, spin coating, brush coating, dip coating, and gravure coating.

Preferably, the first base material may be formed by spin coating using a solution for forming the first base material on the support substrate. According to the spin coating method, a predetermined amount of the solution for forming the first base material is dropped on the support substrate, the support substrate is rotated at a high speed, and the support substrate is coated with the solution by centrifugal force.

According to the method of manufacturing a three-dimensional photodetector according to an embodiment of the present disclosure, since the first base material is formed using spin coating, production costs may be reduced as compared with a deposition process, and process costs and process time may be reduced by simplifying process technology.

The method of manufacturing a three-dimensional photodetector according to an embodiment of the present disclosure includes a step of patterning the first base material so that the first base material corresponds to the base part 110, the first bending part 121, the at least one branch part 130, the second bending parts 122, and the bonding parts 140.

Patterns corresponding to each of the base part 110, the first bending part 121, the at least one branch part 130, the second bending parts 122, and the bonding parts 140 may be formed on the first base material, and then the first base material may be selectively etched, i.e., patterned, to form the base part 110, the first bending part 121, the at least one branch part 130, the second bending parts 122 and the bonding parts 140.

According to the method of manufacturing a three-dimensional photodetector according to an embodiment of the present disclosure, since a material to which photolithography may be applied is used as the first base material, a process for separately applying a photoresist is omitted and thus process technology is simplified, thereby reducing process costs and process time.

The method of manufacturing a three-dimensional photodetector according to an embodiment of the present disclosure includes a step of forming at least one photoresistor on the surface of at least one of the base part 110 and the branch parts 130 of the patterned first base material.

The three-dimensional photodetector according to an embodiment of the present disclosure includes at least one photoresistor formed on the surface of at least one of the base part 110 and the branch parts 130.

The three-dimensional photodetector according to an embodiment of the present disclosure may track the traveling direction of light using the at least one photoresistor.

More specifically, the three-dimensional photodetector according to an embodiment of the present disclosure is formed in a three-dimensional structure using the base part 110, the first bending part 121, the at least one branch part 130, the second bending parts 122, and the bonding parts 140. Thus, when incident light enters the three-dimensional photodetector, at least one photoresistor formed at an entry point through which incident light enters the three-dimensional photodetector may detect the entry point of the incident light. When incident light passes through the three-dimensional photodetector and exits the three-dimensional photodetector, at least one photoresistor formed at an exit point through which incident light exits the three-dimensional photodetector may detect the exit point of the incident light. By detecting the entry point and exit point of incident light, the three-dimensional photodetector may track the traveling direction of incident light and measure a divergence angle of light.

In addition, since the three-dimensional photodetector according to an embodiment of the present disclosure includes the photoresistor including electrodes manufactured using graphene as a two-dimensional material having a high light transmittance and including a channel manufactured using a two-dimensional transition metal chalcogen compound, light may pass through the at least one photoresistor of the three-dimensional photodetector, so that the entry point and exit point of light may be detected.

The structure of the at least one photoresistor and the method of forming the at least one photoresistor will be described in detail with reference to FIGS. 2a and 2b.

The method of manufacturing a three-dimensional photodetector according to an embodiment of the present disclosure includes a step of forming a second base material on the patterned first base material on which the at least one photoresistor is formed.

The second base material may be formed on the patterned first base material including at least one photoresistor. That is, the second base material may be formed entirely on the at least one photoresistor, the base part 110, the first bending part 121, the at least one branch part 130, the second bending parts 122, and the bonding parts 140.

The second base material may be formed in a pattern corresponding to the first base material. Therefore, the at least one photoresistor, the base part 110, the first bending part 121, the at least one branch part 130, the second bending parts 122, and the bonding parts 140 may have a sandwich structure due to the first base material and the second base material.

A transparent polymer may be used as the second base material. For example, the transparent polymer may include at least one of SU-8, a photoresist, polyethylene terephthalate (PET), polyethylene naphthalate (PEN), polyether sulfone (PES), polyimide (PI), polyarylate (PAR), polycarbonate (PC), cycloolefin copolymer (COC), a UV curing resin, and a thermosetting resin.

Preferably, a photoresist or SU-8 is used as the second base material. More preferably, SU-8 is used as the second base material. SU-8 is an epoxy-based negative photoresist, and a negative photoresist refers to a resist in which a portion not irradiated with light is removed by development at the time of exposure.

When SU-8 is used as the second base material included in the three-dimensional photodetector according to an embodiment of the present disclosure, the thickness of the second base material may be easily adjusted. By adjusting the thickness of the second base material, more specifically, by adjusting the thickness of each of the first bending part 121 and the second bending parts 122, when strain is applied, the first bending part 121 and the second bending parts 122 may be easily bended without physical damage such as cracks.

The second base material may be formed by at least one of blade coating, bar coating, spray coating, spin coating, brush coating, dip coating, and gravure coating.

Preferably, the second base material may be formed by spin coating using a solution for forming the second base material on the support substrate. According to the spin coating method, a predetermined amount of the solution for forming the second base material is dropped on the support substrate, the support substrate is rotated at a high speed, and the support substrate is coated with the solution by centrifugal force. When spin coating is used, production costs may be reduced as compared with a deposition process, and process costs and process time may be reduced by simplifying process technology.

The method of manufacturing a three-dimensional photodetector according to an embodiment of the present disclosure includes a step of separating the support substrate from the first base material.

The support substrate may be separated from the first base material using at least one of laser lift-off and chemical etching.

In the case of separating the support substrate using chemical etching, by removing a sacrificial layer formed on the support substrate using an etching solution such as HF, the support substrate may be separated from the first base material.

In addition, in the case of separating the support substrate using laser, when the support substrate is irradiated with laser, the support substrate irradiated with laser is thermally expanded, and then the thermally expanded support substrate is cooled and contracts. By repeating thermal expansion and contraction of the support substrate in this manner, the support substrate may be separated from the first base material.

In addition, since laser outputs a beam of uniform intensity, the laser may always apply uniform heat to the support substrate. When a laser beam is used, a spot may be adjusted to a desired size, and thus the support substrate may be separated by applying heat only at a localized position.

The method of manufacturing a three-dimensional photodetector according to an embodiment of the present disclosure includes a step of forming opening portions on at least one of the first base material and the second base material, which correspond to the first bending part 121 and the second bending parts 122, and obtaining a two-dimensional photodetection structure.

The opening portions may be selectively formed on the first base material or the second base material depending on bending direction.

When the three-dimensional photodetector according to an embodiment of the present disclosure is assembled into a three-dimensional structure, the first bending part 121 and the second bending parts 122 may be bent. At this time, to prevent physical damage that may occur in the first base material, the at least one photoresistor, and the second base material, opening portions may be formed in the first bending part 121 and the second bending parts 122, so that stress concentrated on the first bending part 121 and the second bending parts 122 may be dispersed.

Therefore, the thickness of the first bending part 121 and the thickness of the second bending parts 122 may each be thinner than the thickness of the base part 110 or the thickness of the branch parts 130.

In addition, in the three-dimensional photodetector according to an embodiment of the present disclosure, a material to which photolithography may be applied is used as the second base material. Thus, opening portions may be easily formed using a photolithography process.

The shape and number of the opening portions formed on the first bending part 121 and the second bending parts 122 are not particularly limited and may be variously changed depending on the thickness or size of the first base material or the second base material.

Therefore, according to the method of manufacturing a three-dimensional photodetector according to an embodiment of the present disclosure, a two-dimensional photodetection structure 101, in which the at least one photoresistor, the base part 110, the first bending part 121, the at least one branch part 130, the second bending parts 122, and the bonding parts 140 are sandwiched between the first base material and the second base material, may be obtained.

According to an embodiment, the method of manufacturing a three-dimensional photodetector according to an embodiment of the present disclosure may further include a step of applying photoresists (PRs) to the opening portions formed on at least one of the first base material and the second base material.

Therefore, according to the method of manufacturing a three-dimensional photodetector according to an embodiment of the present disclosure, by filling the opening portions with photoresists (PRs), the first or second base material may be planarized to improve handling characteristics in a subsequent process.

In addition, the photoresists filling the opening portions may be removed at a later process (e.g., an adhering process).

According to an embodiment, the step of obtaining the two-dimensional photodetection structure 101 may further include a step of performing first ultraviolet light/ozone (UV/$O_3$) treatment on the two-dimensional photodetection structure 101.

Preferably, the first ultraviolet light/ozone (UV/$O_3$) treatment may be performed on the surface of the two-dimensional photodetection structure 101 attached to the stretchable substrate.

The first ultraviolet light/ozone (UV/$O_3$) treatment may modify the surface of the two-dimensional photodetection structure 101 to be hydrophilic. More specifically, an ultraviolet light/ozone processor may be used to perform the first ultraviolet light/ozone (UV/$O_3$) treatment for modifying the surface of the two-dimensional photodetection structure 101 to be hydrophilic, and as a result of the treatment, residues present on the surface of the two-dimensional photodetection structure 101 are replaced with —OH, —OOH, —OO—, or the like, thereby reducing a water contact angle.

Therefore, the first ultraviolet light/ozone (UV/$O_3$) treatment may increase surface bonding force between the surface of the two-dimensional photodetection structure 101 and a stretchable substrate to be attached in a subsequent process.

In addition, since ozone concentration increases over time during the first ultraviolet light/ozone (UV/$O_3$) treatment, the two-dimensional photodetection structure 101 may be treated with ultraviolet light 20 to 30 minutes after an ultraviolet light/ozone processor is activated.

The first ultraviolet light/ozone (UV/$O_3$) treatment may be performed for 20 to 30 minutes. When the first ultraviolet light/ozone (UV/$O_3$) treatment is performed for less than 20 minutes, the water contact angle of the surface of the two-dimensional photodetection structure 101 may not be sufficiently small due to insufficient ultraviolet light treatment. When the first ultraviolet light/ozone (UV/$O_3$) treatment is performed for more than 30 minutes, the water contact angle of the surface of the two-dimensional photodetection structure 101 may not be further reduced, thereby lowering yield.

The first ultraviolet light/ozone (UV/$O_3$) treatment time is not limited thereto, and the ultraviolet light treatment time may be adjusted depending on the water contact angle of the stretchable substrate.

Preferably, when the first ultraviolet light/ozone (UV/$O_3$) treatment is performed for 20 minutes or more, the water contact angle is not further reduced. Thus, the optimum treatment time may be 20 minutes. However, when a large amount of organic matter is present on the surface of the two-dimensional photodetection structure 101, a longer treatment time may be required to remove organic matter using ozone. Therefore, the ultraviolet light/ozone treatment may be performed for 20 to 30 minutes depending on the conditions of the two-dimensional photodetection structure 101.

In addition, according to an embodiment, the at least one two-dimensional photodetection structure 101 may be formed on the stretchable substrate of the three-dimensional photodetector of the present disclosure.

The method of manufacturing a three-dimensional photodetector according to an embodiment of the present disclosure includes a step of stretching a stretchable substrate so that the stretchable substrate is in a stretched state.

The stretchable substrate as a substrate having elasticity may be used to manufacture a three-dimensional photodetector 102 and support the three-dimensional photodetector 102.

The stretchable substrate may include at least one of elastomeric silicone, elastomeric polyurethane, elastomeric polyisoprene, and elastomeric urethane acrylate. Preferably, the stretchable substrate may include at least one of polydimethylsiloxane (PDMS), polyester, polyurethane (PU), polyurethane acrylate (PUA), polyphenylmethylsiloxane, hexamethyldisiloxane, an epoxy resin, and EcoFLEX.

The stretchable substrate may be formed of a transparent material or an opaque material.

In addition, according to an embodiment, the method of the present disclosure may further include a step of performing second ultraviolet light/ozone (UV/$O_3$) treatment on the stretchable substrate before stretching the stretchable substrate to form a stretched state.

The second ultraviolet light/ozone (UV/O$_3$) treatment is preferably performed on the surface of the stretchable substrate to which the two-dimensional photodetection structure 101 is attached.

The second ultraviolet light/ozone (UV/O$_3$) treatment may be modify the surface of the stretchable substrate to be hydrophilic. More specifically, an ultraviolet light/ozone processor may be used to perform the second ultraviolet light/ozone (UV/O$_3$) treatment for modifying the surface of the stretchable substrate to be hydrophilic, and as a result of the treatment, residues present on the surface of the stretchable substrate are replaced with —OH, —OOH, —OO—, or the like, thereby reducing a water contact angle.

Therefore, the second ultraviolet light/ozone (UV/O$_3$) treatment may increase surface bonding force between the surface of the stretchable substrate and the two-dimensional photodetection structure 101 to be attached in a subsequent process.

In addition, since ozone concentration increases over time during the second ultraviolet light/ozone (UV/O$_3$) treatment, the stretchable substrate may be treated with ultraviolet light 20 to 30 minutes after an ultraviolet light/ozone processor is activated.

The second ultraviolet light/ozone (UV/O$_3$) treatment may be performed for 20 to 30 minutes. When the second ultraviolet light/ozone (UV/O$_3$) treatment is performed for less than 20 minutes, the water contact angle of the surface of the stretchable substrate may not be sufficiently small due to insufficient ultraviolet light treatment. When the second ultraviolet light/ozone (UV/O$_3$) treatment is performed for more than 30 minutes, the water contact angle of the surface of the stretchable substrate may not be further reduced, thereby lowering yield.

The second ultraviolet light/ozone (UV/O$_3$) treatment time is not limited thereto, and the ultraviolet light treatment time may be adjusted depending on the water contact angle of the stretchable substrate.

Preferably, when the second ultraviolet light/ozone (UV/O$_3$) treatment is performed for 20 minutes or more, the water contact angle is further reduced. Thus, the optimum treatment time may be 20 minutes. However, when a large amount of organic matter is present on the surface of the stretchable substrate, a longer treatment time may be required to remove organic matter using ozone. Therefore, the ultraviolet light/ozone treatment may be performed for 20 to 30 minutes depending on the conditions of the stretchable substrate.

The method of manufacturing a three-dimensional photodetector according to an embodiment of the present disclosure includes a step of attaching the two-dimensional photodetection structure to the stretchable substrate in a stretched state.

The two-dimensional photodetection structure 101 may be transferred to a water-soluble tape using a flat slab made of polydimethylsiloxane (PDMS), and then the water-soluble tape having the two-dimensional photodetection structure 101 attached thereto may be attached to the stretchable substrate in a stretched state, and then the water-soluble tape may be removed using water.

Polyvinyl alcohol (PVA) may be used as the water-soluble tape.

Since the first ultraviolet light/ozone (UV/O$_3$) treatment and the second ultraviolet light/ozone (UV/O$_3$) treatment are performed on the adhesive surface of each of the stretchable substrate and the two-dimensional photodetection structure 101, the bonding energy of the adhesive surfaces is increased, so that the stretchable substrate and the two-dimensional photodetection structure 101 may be easily attached.

The method of manufacturing a three-dimensional photodetector according to an embodiment of the present disclosure includes a step of weakening a bonding force between the stretchable substrate and the base part 110, the first bending part 121, the at least one branch part 130, and the second bending parts 122.

According to the method of manufacturing a three-dimensional photodetector according to an embodiment of the present disclosure, the two-dimensional photodetection structure 101 is converted into the three-dimensional photodetector 102 using the stretched/non-stretched state of the stretchable substrate. Accordingly, the bonding energy of the base part 110, the first bending part 121, the at least one branch part 130, and the second bending parts 122 except for the bonding parts 140 attached to the stretchable substrate in a stretched state should be reduced.

Therefore, the first bending part 121, the at least one branch part 130, and the second bending parts 122 formed on the first base material (or second base material) of the two-dimensional photodetection structure 101 attached to the stretchable substrate may be subjected to acetone treatment to reduce bonding energy, or partial peeling may be performed to reduce the bonding energy of the first bending part 121, the at least one branch part 130, and the second bending parts 122 attached to the stretchable substrate.

The method of manufacturing a three-dimensional photodetector according to an embodiment of the present disclosure includes a step of releasing the stretched state of the stretchable substrate to self-assemble the two-dimensional photodetection structure into a three-dimensional structure.

According to the method of manufacturing a three-dimensional photodetector according to an embodiment of the present disclosure, when the stretchable substrate is in a stretched state, a two-dimensional structure, in which the bonding parts of the two-dimensional photodetection structure 101 are attached to the surface of the stretchable substrate in a stretched state, is exhibited. When the stretched stretchable substrate is restored to a non-stretched state, i.e., an original state thereof, the first bending part 121 and the second bending parts 122 of the two-dimensional photodetection structure 101 are bent. As a result, the two-dimensional structure may be self-assembled into the three-dimensional photodetector 102.

Therefore, when the method of manufacturing a three-dimensional photodetector according to an embodiment of the present disclosure is used, the three-dimensional photodetector 102 may be easily manufactured using the stretchable substrate without any additional equipment.

According to the method of the present disclosure, the maximum durability limit may be controlled by adjusting parameters such as the thickness, angle, and design of the three-dimensional photodetector 102 or the stretch degree of the stretchable substrate. Through such control, mechanical deterioration due to strain caused by bending or twisting may be prevented.

In the three-dimensional photodetector 102 according to an embodiment of the present disclosure, gap (h) between the base part 110 and the stretchable substrate, a width ratio ($W_1/W_0$) between the first bending part 121 and the second bending parts 122, or an angle ($\Psi$) between the base part 110 and the stretchable substrate may be controlled by adjusting the size of the first base material or the second base material or changing the design of the first base material or the second base material.

For example, in the case of the three-dimensional photodetector 102 according to an embodiment of the present disclosure, when self-assembly occurs, the height (h) of the gap between the base part 110 and the stretchable substrate may be 1.4 mm. However, the height (h) of the gap is not limited thereto, and the height of gap between the base part 110 and the stretchable substrate may vary depending on the range of light (e.g., a laser beam) to be measured.

For example, when the three-dimensional photodetector 102 according to an embodiment of the present disclosure is manufactured in the form of an octagonal column, an angle (Ψ) between the base part 110 and the stretchable substrate may be 90°. When the three-dimensional photodetector 102 is manufactured in the form of a hemispherical dome, an angle (Ψ) between the base part 110 and the stretchable may be 90° or less. As an angle (Ψ) between the base part 110 and the stretchable substrate approaches 180°, the three-dimensional photodetector 102 according to an embodiment of the present disclosure may be manufactured into a sphere having an ideal shape, without being limited thereto.

In addition, according to the three-dimensional photodetector 102 according to an embodiment of the present disclosure, the size of the three-dimensional photodetector 102 may be variously adjusted depending on the type of light (e.g., a laser beam) to be measured.

In addition, according to the three-dimensional photodetector 102 according to an embodiment of the present disclosure, the measuring range of light (e.g., a laser beam) to be measured may be controlled by adjusting the number of photoresistors formed on the first base material or the number of the three-dimensional photodetector 102 formed on the stretchable substrate.

Therefore, when the measuring range of light to be measured is limited due to size limitations of the device, the measuring range of light may be variously controlled by adjusting at least one of the size of the three-dimensional photodetector 102 according to an embodiment of the present disclosure, the number of the photodetector 102, the design of the photodetector 102, the size of a photoresist layer, the number of a photoresist layer, the design of a photoresist layer, the thickness of the first base material, and the thickness of the second base material.

The three-dimensional photodetector 102 according to an embodiment of the present disclosure may have various three-dimensional shapes.

The shape of the three-dimensional photodetector 102 according to an embodiment of the present disclosure may be optimized using 3D finite element analysis (3D FEA).

In addition, since the three-dimensional photodetector 102 according to an embodiment of the present disclosure has a three-dimensional structure and includes the stretchable substrate, the three-dimensional photodetector 102 may be stably operated under conditions wherein mechanical strain such as stretching, bending, or twisting is applied.

In addition, the at least one two-dimensional photodetection structure 101 may be formed on the stretchable substrate of the three-dimensional photodetector according to an embodiment of the present disclosure. Accordingly, a three-dimensional photodetector array including the stretchable substrate on which the at least one three-dimensional photodetector 102 is formed may be manufactured.

Therefore, when the three-dimensional photodetector according to an embodiment of the present disclosure is included in a three-dimensional photodetector array, light detection accuracy may be further improved.

Hereinafter, the photoresistor included in the three-dimensional photodetector according to an embodiment of the present disclosure will be described with reference to FIGS. 2A and 2B.

FIG. 2A shows a three-dimensional view of the three-dimensional photodetector according to an embodiment of the present disclosure and cross-sectional views of the photoresistor included in the three-dimensional photodetector.

Since some of the constituent elements of the photoresistor included in the three-dimensional photodetector according to an embodiment of the present disclosure are the same as those of the three-dimensional photodetector according to an embodiment, description of the same constituent elements will be omitted.

A photoresistor 200 may include a first electrode 221 and a second electrode 222, which are formed on a first base material 210 and are spaced apart from each other; a two-dimensional transition metal chalcogen compound (2D transition metal dichalcogenides) channel 230, which is formed on the first base material 210 and disposed between the first electrode 221 and the second electrode 222; and a second base material 220 formed on the first base material 210 on which the first electrode 221, the second electrode 222, and the two-dimensional transition metal chalcogen compound channel 230 are formed.

According to the three-dimensional photodetector according to an embodiment of the present disclosure, since two-dimensional materials are used as the first electrode 221, the second electrode 222, and the channel 230, the three-dimensional photodetector has excellent applicability to photolithography, and excellent mechanical properties, and thus may exhibit stable characteristics even at high strain.

Therefore, since the three-dimensional photodetector according to an embodiment of the present disclosure exhibits stable characteristics even at high external strain, the three-dimensional photodetector may be applied to a field requiring a lot of strain.

Hereinafter, the structure of the photoresistor included in the three-dimensional photodetector according to an embodiment of the present disclosure will be described with reference to the method of manufacturing the photoresistor in detail.

The method of manufacturing the photoresistor included in the three-dimensional photodetector according to an embodiment of the present disclosure includes a step of forming the first electrode 221 and the second electrode 222 on the surface of at least one of the base part and the branch parts of the patterned first base material 210, so that the first electrode 221 and the second electrode 222 are spaced apart from each other.

The method of manufacturing the photoresistor included in the three-dimensional photodetector according to an embodiment of the present disclosure may further include a step of forming a first protective layer on the patterned first base material 210 before the first electrode 221 and the second electrode 222 are formed.

The first protective layer may prevent the photoresistor from being damaged due to moisture or oxygen.

The first protective layer may include at least one of aluminum oxide ($Al_2O_3$), silicon oxide ($SiO_2$), silicon oxynitride (SiON), hafnium oxide (HfOx), zirconium oxide ($ZrO_2$), magnesium oxide (MgO), titanium oxide ($TiO_2$), zinc oxide (ZnO), tungsten oxide ($WO_3$), tantalum oxide (Ta$_2$O$_5$), niobium oxide (Nb$_2$O$_5$), yttrium oxide (Y$_2$O$_3$), cerium oxide (CeO$_2$), lanthanum oxide (La$_2$O$_3$), erbium oxide (Er$_2$O$_3$), hafnium aluminum oxide (HfAlO), hafnium silicon oxide (HfSiO), zirconium silicon oxide (ZrSiO), zirconium aluminum oxide (ZrAlO), hafnium oxynitride (HfON), hafnium silicon oxynitride (HfSiON), silicon nitride (SiN$_x$), silicon boron nitride (SiBN), and hexagonal-boron nitride (h-BN), without being limited thereto, and a pattern and thickness adjustable material may be used as the first protective layer.

In addition, a thin film made of a polymer including at least one of polyethylene terephthalate, polyvinylidene fluoride, polymethyl methacrylate, and polyimide may be used as the first protective layer.

Preferably, the first protective layer may include aluminum oxide (Al$_2$O$_3$).

The first protective layer may be formed using at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

The first protective layer will be described in more detail with reference to FIGS. 3a to 4b.

The first base material 210 or a second base material 240 may include SU-8, and the first base material 210 may be formed using spin coating.

The first electrode 221 and the second electrode 222 may include graphene, which is a two-dimensional material. In addition, the first electrode 221 and the second electrode 222 may have an interdigitated structure.

The first electrode 221 and the second electrode 222 may be formed by depositing or transferring graphene to the first base material 210. In this case, a reduced graphene oxide may be used.

In addition, the first electrode 221 and the second electrode 222 may be formed as a single layer or multiple layers. The first electrode 221 and the second electrode 222 may be formed by directly growing graphene on the first base material 210.

The method of manufacturing the photoresistor included in the three-dimensional photodetector according to an embodiment of the present disclosure includes a step of forming the two-dimensional transition metal chalcogen compound channel 230 on the surface of at least one of the base part and the branch parts of the patterned first base material 210, wherein the two-dimensional transition metal chalcogen compound channel 230 is disposed between the first electrode 221 and the second electrode 222.

For example, the two-dimensional transition metal chalcogen compound channel 230 may be formed by physical flaking using Scotch tape. In addition, the two-dimensional transition metal chalcogen compound channel 230 may be formed by chemical flaking in which flaking is performed by inserting an acid or the like between layered structures, liquid flaking in which flaking is performed by dispersing an object in an organic solvent, physical deposition, hydrothermal synthesis, electrochemical synthesis, sulfation of molybdenum oxide, pyrolysis of precursors containing sulfur, or chemical vapor deposition (CVD) which is used to synthesize graphene.

The two-dimensional transition metal chalcogen compound channel 230 may include at least one of molybdenum disulfide (MoS$_2$), molybdenum diselenide (MoSe$_2$), tungsten disulfide (WS$_2$), tungsten diselenide (WSe$_2$), tungsten ditelluride (WTe$_2$), molybdenum ditelluride (MoTe$_2$), tin diselenide (SnSe$_2$), zirconium disulfide (ZrS$_2$), zirconium diselenide (ZrSe$_2$), hafnium disulfide (HfS$_2$), hafnium diselenide (HfSe$_2$), niobium diselenide (NbSe$_2$), and rhenium diselenide (ReSe$_2$), without being limited thereto, and various two-dimensional materials may be used as the channel 230.

Preferably, molybdenum disulfide (MoS$_2$) having a direct band gap of 1.9 eV may be used as the two-dimensional transition metal chalcogen compound channel 230.

According to an embodiment, the method of manufacturing the photoresistor included in the three-dimensional photodetector according to an embodiment of the present disclosure may further include a step of forming a second protective layer on the patterned first base material 210 on which the first electrode 221, the second electrode 222, and the two-dimensional transition metal chalcogen compound channel 230 are formed.

The second protective layer may prevent the photoresistor 200 from being damaged due to moisture or oxygen.

The second protective layer may include at least one of aluminum oxide (Al$_2$O$_3$), silicon oxide (SiO$_2$), silicon oxynitride (SiON), hafnium oxide (HfOx), zirconium oxide (ZrO$_2$), magnesium oxide (MgO), titanium oxide (TiO$_2$), zinc oxide (ZnO), tungsten oxide (WO$_3$), tantalum oxide (Ta$_2$O$_5$), niobium oxide (Nb$_2$O$_5$), yttrium oxide (Y$_2$O$_3$), cerium oxide (CeO$_2$), lanthanum oxide (La$_2$O$_3$), erbium oxide (Er$_2$O$_3$), hafnium aluminum oxide (HfAlO), hafnium silicon oxide (HfSiO), zirconium silicon oxide (ZrSiO), zirconium aluminum oxide (ZrAlO), hafnium oxynitride (HfON), hafnium silicon oxynitride (HfSiON), silicon nitride (SiN$_x$), silicon boron nitride (SiBN), and hexagonal-boron nitride (h-BN), without being limited thereto. A pattern and thickness adjustable material may be used as the second protective layer.

In addition, a thin film made of a polymer including at least one of polyethylene terephthalate, polyvinylidene fluoride, polymethyl methacrylate, and polyimide may be used as the second protective layer.

Preferably, the second protective layer may include aluminum oxide (Al$_2$O$_3$). The second protective layer may be formed by at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

The second protective layer will be described in more detail with reference to FIGS. 3a to 4b.

The method of manufacturing the photoresistor included in the three-dimensional photodetector according to an embodiment of the present disclosure includes a step of forming the second base material 240 on the patterned first base material 210 on which the first electrode 221, the second electrode 222, and the two-dimensional transition metal chalcogen compound channel 230 are formed.

Preferably, the second base material 240 may include SU-8, and may be formed using spin coating.

Therefore, in the case of the photoresistor 200 manufactured using the method of manufacturing the photoresistor included in the three-dimensional photodetector according to an embodiment of the present disclosure, since two-dimensional materials are used as the first electrode 221, the second electrode 222, and the channel 230, the photoresistor 200 has excellent applicability to photolithography, and excellent mechanical properties due to thin atomic thickness thereof, and thus may exhibit stable characteristics even at high strain.

In addition, the structure of the photoresistor 200 is not limited thereto. According to an embodiment, the photoresistor 200 may include the first electrode 221 and the second electrode 222, which are formed on the first base material 210 and spaced apart from each other; a p-type two-dimensional transition metal chalcogen compound and an n-type two-dimensional transition metal chalcogen compound, which are formed on the first base material 210 and disposed between the first electrode 221 and the second electrode 222; and the second base material 240 formed on the first base material 210 on which the first electrode 221, the second electrode 222, the p-type two-dimensional transition metal chalcogen compound, and the n-type two-dimensional transition metal chalcogen compound are formed.

A PN diode including the n-type two-dimensional transition metal chalcogen compound and the p-type two-dimensional transition metal chalcogen compound, which are formed between the first electrode 221 and the second electrode 222, may have a horizontal structure in which the n-type two-dimensional transition metal chalcogen compound and the p-type two-dimensional transition metal chalcogen compound are arranged side by side in the horizontal direction, or a vertical structure in which the n-type two-dimensional transition metal chalcogen compound and the p-type two-dimensional transition metal chalcogen compound are stacked.

In addition, the photoresistor 200 may have a hetero P-N junction structure or a homo P-N junction structure.

In the case of the photoresistor 200 having a hetero P-N junction structure, the n-type two-dimensional transition metal chalcogen compound and the p-type two-dimensional transition metal chalcogen compound, which are different from each other, may be disposed between the first electrode 221 and the second electrode 222.

Molybdenum disulfide ($MoS_2$) or tungsten disulfide ($WS_2$) may be used as the n-type two-dimensional transition metal chalcogen compound, and tungsten diselenide ($WSe_2$) or molybdenum ditelluride ($MoTe_2$) may be used as the p-type two-dimensional transition metal chalcogen compound, without being limited thereto.

The photoresistor 200 having a homo P-N junction structure may include the n-type two-dimensional transition metal chalcogen compound and the p-type two-dimensional transition metal chalcogen compound, which are formed by doping at least a portion of the two-dimensional transition metal chalcogen compound channel 230 with an n-type dopant or a p-type dopant.

The doping process may be performed according to an ion implantation manner or a chemical doping manner using the p-type dopant or the n-type dopant.

As the source of the p-type dopant, an ionic liquid, such as $NO_2BF_4$, $NOBF_4$, and $NO_2SbF_6$, acidic compounds, such as HCl, $H_2PO_4$, $CH_3COOH$, $H_2SO_4$, and $HNO_3$, and organic compounds, such as dichlorodicyanoquinone (DDQ), oxone, dimyristoylphosphatidylinositol (DMPI), and trifluoromethanesulfonimide, may be used. In addition, $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, and the like may be used as the source of the p-type dopant, As the source of the n-type dopant, a reduction product of a substituted or unsubstituted nicotinamide; a reduction product of a compound which is chemically bound to a substituted or unsubstituted nicotinamide; and a compound including at least two pyridinium moieties in which a nitrogen atom of at least one of the pyridinium moieties is reduced may be used.

For example, the source of the n-type dopant may include nicotinamide mononucleotide-H (NMNH), nicotinamide adenine dinucleotide-H (NADH), and nicotinamide adenine dinucleotide phosphate-H (NADPH), or may include viologen. The source of the n-type dopant may include polymers such as polyethylenimine (PEI). The n-type dopant may include alkali metal, such as K and Li.

However, the above-described p-type dopant and n-type dopant material (source) are illustrative and not limited thereto, and various other materials may be used.

In addition, the respective parts (the base part, the branch part (①), the bonding part (②), and the interconnect) included in the three-dimensional photodetector according to an embodiment of the present disclosure may be formed in different layer structures.

Referring to FIG. 2A, in the three-dimensional photodetector according to an embodiment of the present disclosure, the branch part (①) includes photoresistors, but the first bending part, the second bending part (②), and the bonding part (②) do not include photoresistors. In addition, the interconnect part (③) responsible for connecting the three-dimensional photodetector according to an embodiment of the present disclosure to the outside does not include photoresistors.

Therefore, the first bending part, the second bending part, the bonding part (②), and the interconnect part (③) include the first base material 210, the first electrode 221 or the second electrode 222, and the second base material 240, but do not include the two-dimensional transition metal chalcogen compound channel 230.

More specifically, the process of forming the first bending part, the second bending part (②), and the bonding part (②) may be performed in the same manner as the process of forming the branch part (①) except for forming the two-dimensional transition metal chalcogen compound channel 230.

In addition, the first bending part and the second bending part (②) may be provided with an opening portion (OP) for guiding bending of a two-dimensional photodetection structure. Therefore, the thickness of the first bending part and the thickness (T1) of the second bending part (②) may each be thinner than the thickness of the base part or the thickness (T2) of the branch part.

The opening portion (OP) may be formed on at least one of the first base material 210 and the second base material 240 according to user selection. In addition, the position where the opening portion (OP) is formed may be selected in accordance with bending direction.

Figure 2B:
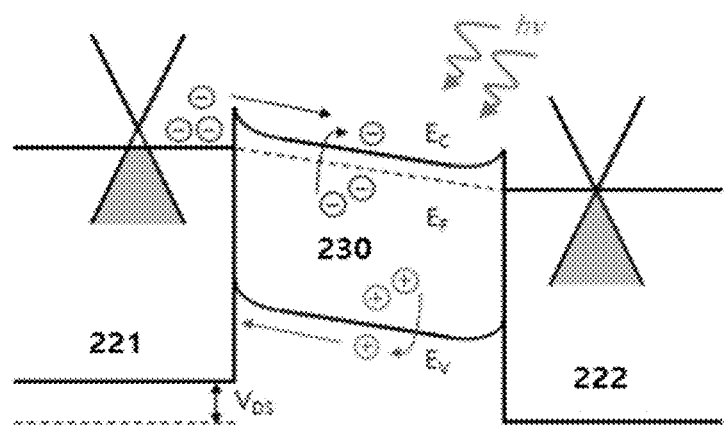
FIG. 2B is a diagram illustrating the band gap energy of a photoresistor included in a three-dimensional photodetector according to an embodiment of the present disclosure.

FIG. 2B is a diagram illustrating the band gap energy of a photoresistor included in the three-dimensional photodetector according to an embodiment of the present disclosure.

Referring to FIG. 2B, when light is incident, a bias voltage is generated, and as a result, electrons (black) and holes (gray) of a photoresistor included in the three-dimensional photodetector according to an embodiment of the present disclosure may generate photocurrent.

The solid lines represent a valence band (EV) and a conduction band (EC), and the dashed line represents Fermi level.

In addition, when the threshold voltage exceeds 0 ($V_{DS}>0$), the holes move in the valence band direction (gray arrow), and the electrons move in the conduction band direction (black arrow).

Figure 3A:
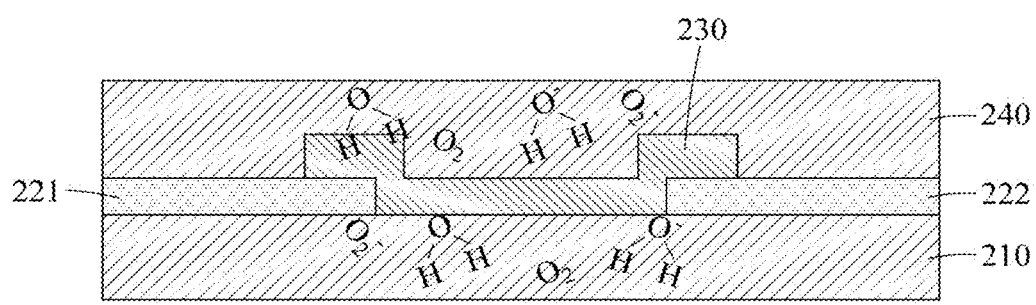
FIGS. 3A to 3C include cross-sectional views of a photoresistor including a first protective layer or a second protective layer.
Figure 3B:
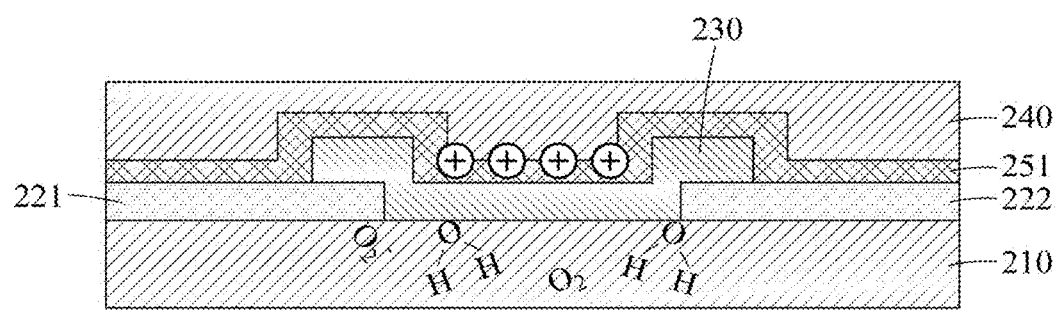
Figure 3C:
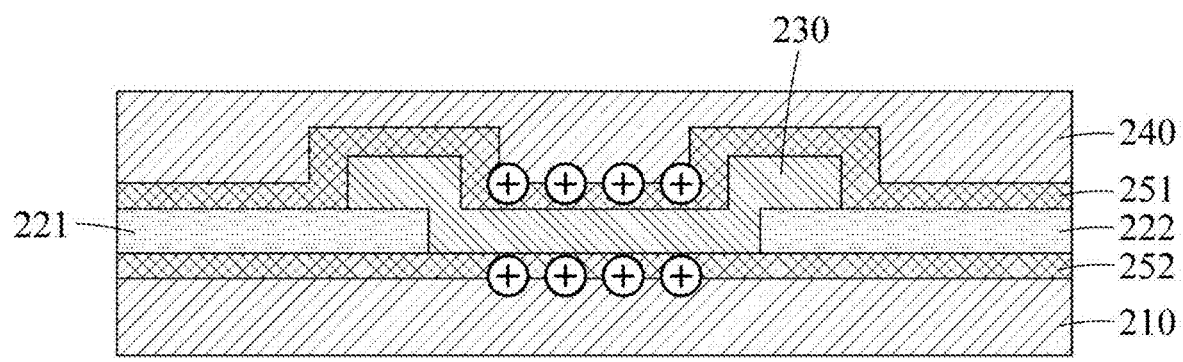

FIGS. 3A to 3C include cross-sectional views of a photoresistor including a first protective layer or a second protective layer.

FIGS. 3A to 3C include the same components as those of the photoresistor included in a three-dimensional photodetector according to an embodiment of the present disclosure illustrated in FIG. 2A. Therefore, the same components are not described.

FIG. 3A is a cross-sectional view of a photoresistor included in a three-dimensional photodetector according to an embodiment of the present disclosure, wherein the photoresistor does not include a first protective layer and a second protective layer, FIG. 3B is a cross-sectional view of a photoresistor included in a three-dimensional photodetector according to an embodiment of the present disclosure, wherein the photoresistor includes only one first protective layer, and FIG. 3C is a cross-sectional view of a photoresistor included in a three-dimensional photodetector according to an embodiment of the present disclosure, wherein the photoresistor includes a first protective layer and a second protective layer.

Referring to FIGS. 3B and 3C, the photoresistor included in the three-dimensional photodetector according to an embodiment of the present disclosure may include a first protective layer 251 formed on the lower surface of the second base material 240 or a second protective layer 252 formed on the upper surface of the first base material 210 or both the first protective layer 251 formed on the lower surface of the second base material 240 and the second protective layer 252 formed on the upper surface of the first base material.

Preferably, the photoresistor included in the three-dimensional photodetector according to an embodiment of the present disclosure may be encapsulated so that the first protective layer 251 and the second protective layer 252 cover all of the two-dimensional transition metal chalcogen compound channel 230, the first electrode 221, and the second electrode 222. As a result, the reactivity of the photoresistor to light may be increased by about 20 times.

More specifically, the first protective layer 251 and the second protective layer 252 may reduce the surface roughness of the two-dimensional transition metal chalcogen compound channel 230, and may provide clean and conformal contact, thereby reducing traps at the interface of the two-dimensional transition metal chalcogen compound channel 230.

In addition, by providing a high dielectric dissimilarity between the two-dimensional transition metal chalcogen compound channel 230 and the protective layer 251 and the second protective layer 252 using a high-k dielectric material as the first protective layer 251 and the second protective layer 252, generation of Coulombic impurities at the interface of the two-dimensional transition metal chalcogen compound channel 230 may be prevented, and transmission of carrier traps may be reduced.

Therefore, in the case of the three-dimensional photodetector according to an embodiment of the present disclosure including the photoresistor including the first protective layer 251 and the second protective layer 252, since carrier transmission speed according to light is increased, response speed may be increased.

The first protective layer 251 and the second protective layer 252 may include at least one of aluminum oxide ($Al_2O_3$), silicon oxide ($SiO_2$), silicon oxynitride (SiON), hafnium oxide (HfOx), zirconium oxide ($ZrO_2$), magnesium oxide (MgO), titanium oxide ($TiO_2$), zinc oxide (ZnO), tungsten oxide ($WO_3$), tantalum oxide ($Ta_2O_5$), niobium oxide ($Nb_2O_5$), yttrium oxide ($Y_2O_3$), cerium oxide ($CeO_2$), lanthanum oxide ($La_2O_3$), erbium oxide ($Er_2O_3$), hafnium aluminum oxide (HfAlO), hafnium silicon oxide (HfSiO), zirconium silicon oxide (ZrSiO), zirconium aluminum oxide (ZrAlO), hafnium oxynitride (HfON), hafnium silicon oxynitride (HfSiON), silicon nitride ($SiN_x$), silicon boron nitride (SiBN), and hexagonal-boron nitride (h-BN), without being limited thereto, and a pattern and thickness adjustable material may be used.

In addition, a thin film made of a polymer including at least one of polyethylene terephthalate, polyvinylidene fluoride, polymethyl methacrylate, and polyimide may be used as the first protective layer 251 and the second protective layer 252.

Preferably, the first protective layer 251 and the second protective layer 252 may include aluminum oxide ($Al_2O_3$).

Aluminum oxide, a high-k dielectric, may reduce interface trap charge and illuminance and form a clean interface. Thus, aluminum oxide may effectively inhibit generation of Coulombic impurities due to the low roughness of the interface.

The first protective layer 251 and the second protective layer 252 may be formed using at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Figure 4A:
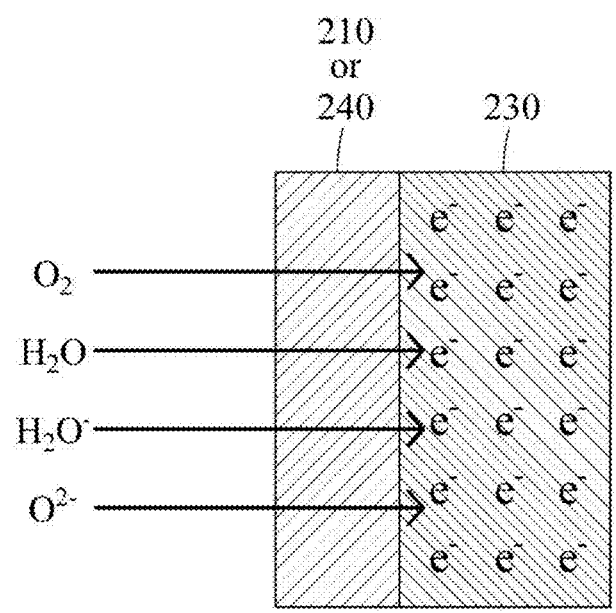
FIGS. 4A and 4B include cross-sectional views of a photoresistor included in a three-dimensional photodetector according to an embodiment of the present disclosure, showing reaction occurring in the photoresistor including a first protective layer and a second protective layer.
Figure 4B:
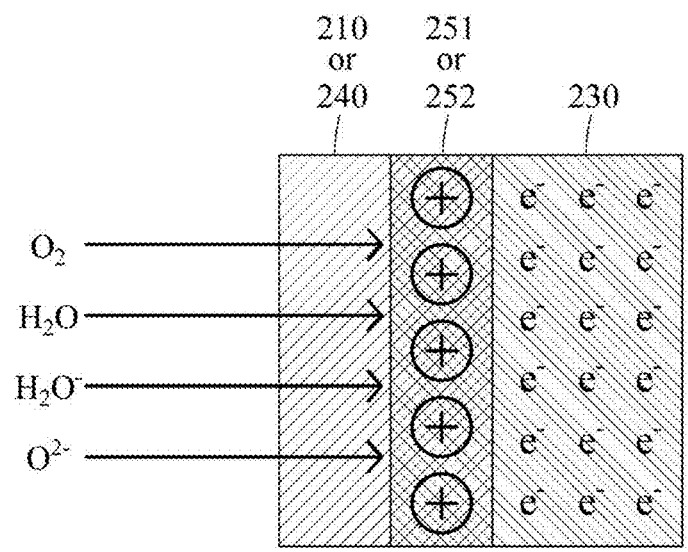

FIGS. 4A and 4B include cross-sectional views of the photoresistor included in the three-dimensional photodetector according to an embodiment of the present disclosure, showing reaction occurring in the photoresistor including a first protective layer and a second protective layer.

FIGS. 4A and 4B include the same components as those of the photoresistor included in a three-dimensional photodetector according to an embodiment of the present disclosure illustrated in FIG. 2A. Therefore, the same components are not described.

Referring to FIG. 4A, in the case of the photoresistor not including the first protective layer 251 and the second protective layer 252, water ($H_2O$) molecules and oxygen ($O_2$) molecules are trapped at the two-dimensional transition metal chalcogen compound channel 230 interface. At this time, the carriers of the two-dimensional transition metal chalcogen compound channel 230 may be depleted.

On the other hand, as shown in FIG. 4B, in the case of the photoresistor including the first protective layer 251 and the second protective layer 252, the first protective layer 251 and the second protective layer 252 having a high-k dielectric responsible for encapsulating the two-dimensional transition metal chalcogen compound channel 230, the first electrode 221, and the second electrode 222 are formed. Thus, a phenomenon that carriers are trapped at the interface of the two-dimensional transition metal chalcogen compound channel 230 by water ($H_2O$) molecules and oxygen ($O_2$) molecules may be suppressed, and thus photoreactivity may be greatly improved.

Manufacturing Example

Preparation of Two-Dimensional Material

Single layer graphene and molybdenum disulfide ($MoS_2$) are grown on a copper foil (Cu foil) and a $Si/SiO_2$ wafer. Single layer graphene and molybdenum disulfide ($MoS_2$) are grown using low pressure chemical vapor deposition (LPCVD) and metalorganic chemical vapor deposition (MOCVD), respectively.

A copper foil (16×8 $cm^2$) was placed in a circular quartz tube, thermal annealing was performed in the presence of $H_2$ gas (8 sccm) at 80 mTorr and 1000° C. for 2 hours, and $CH_4$ precursor gas (20 sccm) at a pressure of 1.6 Torr was introduced into a chamber for 1 hour. Thereafter, the quartz tube (heating zone) was naturally cooled at a rapid rate at an early stage, and then the temperature of the quartz tube was gradually raised up to room temperature at 80 mTorr in the presence of $H_2$ gas (8 sccm).

Molybdenum hexacarbonyl (MHC) and dimethyl sulfide (DMS) were used as precursors of molybdenum (Mo) and sulfur (S) for growing molybdenum disulfide ($MoS_2$), respectively.

Then, gas phase MHC (0.5 sccm) and DMS (1 sccm) were injected into the MOCVD quartz tube with $H_2$ gas (10 sccm) and Ar (300 sccm), and the quartz tube was heated to 550° C. at 7.5 Torr and maintained for 20 hours at the same temperature and pressure.

The single layer graphene was prepared in the same manner as molybdenum disulfide using LPCVD.

Transfer Process of Two-Dimensional Material

During the process of transferring molybdenum disulfide to the upper part of graphene, spin coating was performed using polymethyl methacrylate (PMMA) used as a support (the other surface was etched by oxygen plasma). The copper foil was etched by floating the PMMA-coated graphene/copper foil in an ammonium persulfate (APS) solution (20 g/L) for 5 hours, and the PMMA-coated graphene was floated several times in deionized water to remove APS residues. Finally, the graphene was transferred to a desired wafer, and PMMA was removed using acetone.

Molybdenum disulfide was transferred in the same manner as the single layer graphene except for the following process.

In the case of molybdenum disulfide, $SiO_2$ was etched by floating the PMMA-coated molybdenum disulfide $SiO_2$/Si wafer in a dilute hydrofluoric acid (HF) solution (1%).

Then, the PMMA-coated molybdenum disulfide (PMMA-coated $MoS_2$) was floated several times in deionized water to remove hydrofluoric acid (HF) residues.

Manufacture of Three-Dimensional Photodetector

Si/$SiO_2$ was spin-coated with SU-8 to form a first base material having a thickness of 2 μm, and then the first base material was patterned so that the first base material corresponds to octagonal prismoid, octagonal prism, and hemispherical shapes, respectively. Graphene was transferred to the patterned first base material, and then reactive ion etching (ME) and photolithography were performed using oxygen plasma ($O_2$ plasma, 40 sccm, 100 W, 5 s) to form a first electrode and a second electrode of an interdigitated pattern.

Molybdenum disulfide ($MoS_2$) was transferred to the first and second electrodes of an interdigitated pattern, and reactive ion etching (RIE) and photolithography were performed using fluoroform/oxygen ($CHF_3$/$O_2$) plasma (35/10 sccm, 100 W, 5 s) to form a two-dimensional transition metal chalcogen compound channel. Subsequently, the first base material on which the two-dimensional transition metal chalcogen compound channel, the first electrode, and the second electrode were formed was spin-coated with SU-8 to form a second base material having a thickness of 5 μm, and patterning of opening portions were performed to form a first bending part and second bending parts, and a two-dimensional photodetection structure is manufactured. Photoresists (PRs) were spin-coated and patterned so that the photoresists were formed on parts excluding bonding parts, and bonding parts and non-bonding parts (a base part, a first bending part, second bending parts, and branch parts) were formed.

Thereafter, the two-dimensional photodetection structure was transferred to a PVA tape using hydrofluoric acid (HF) treatment and a PDMS slab.

A stretchable substrate (Dragon Skin, Smooth-On) was pre-stretched in the biaxial direction to a strain optimized by FEA simulation, and the stretched stretchable substrate and the two-dimensional photodetection structure attached to the PVA tape were exposed to UV/$O_3$. Then, the biaxially stretched stretchable substrate and the two-dimensional photodetection structure were stacked and baked in an oven at a temperature of 70° C. for 5 minutes, and the PVA tape was dissolved in deionized water (DI).

Finally, the photoresists (PRs) were dissolved in acetone to weaken bonding force between the biaxially stretched stretchable substrate and the non-bonding parts, and the stretched state of the biaxially stretched stretchable substrate was released to obtain a three-dimensional photodetector.

Figure 5A:
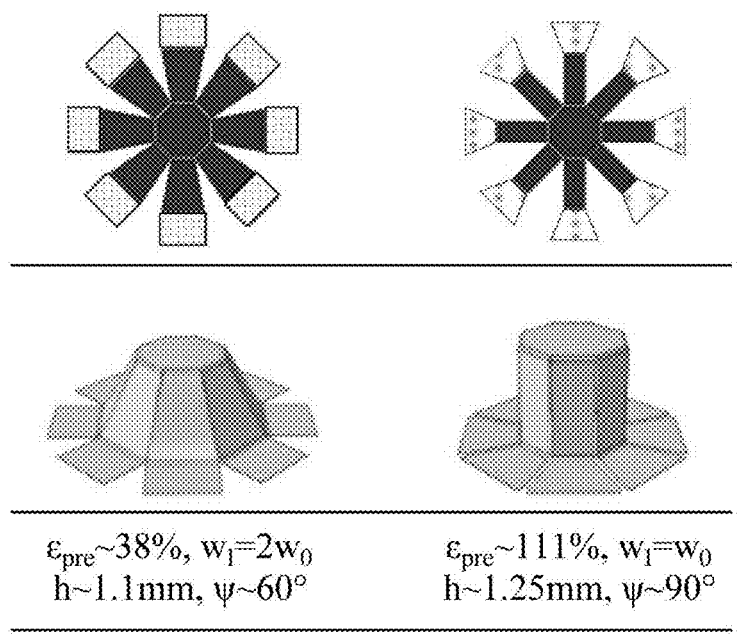
FIG. 5A shows the octagonal prismoid shape and octagonal prism shape of a three-dimensional photodetector according to an embodiment of the present disclosure and shape parameters and key design parameters according to each shape.

FIG. 5A shows the octagonal prismoid shape and octagonal prism shape of a three-dimensional photodetector according to an embodiment of the present disclosure and shape parameters and key design parameters according to each shape.

Referring to FIG. 5A, the three-dimensional photodetector of an octagonal prismoid shape according to an embodiment of the present disclosure has a pre-strain value of 28%, the three-dimensional photodetector of an octagonal prism shape according to an embodiment of the present disclosure has a pre-strain value of 111%, and the three-dimensional photodetector of a hemispherical shape according to an embodiment of the present disclosure has a pre-strain value of 46%.

Figure 5B:
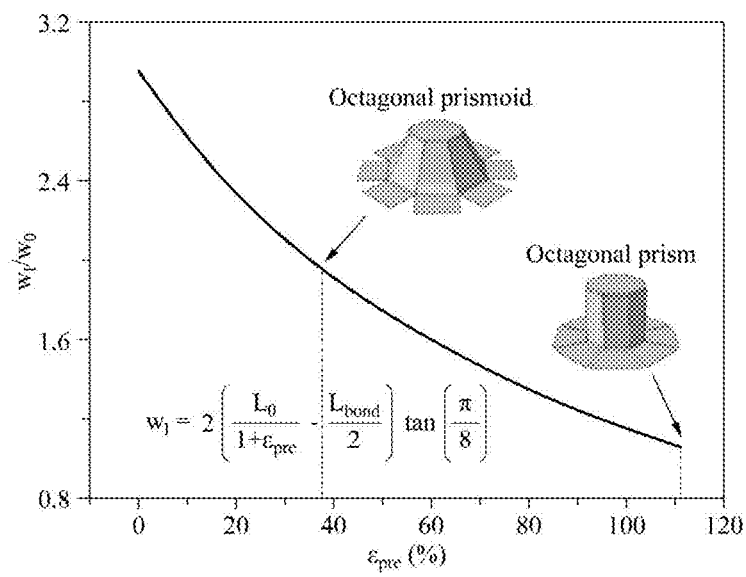
FIG. 5B is a graph showing width ratio ($W_1/W_0$) parameters for a first bending part and a second bending part with respect to the pre-strain value of a three-dimensional photodetector according to an embodiment of the present disclosure.

FIG. 5B is a graph showing width ratio ($W_1$/$W_0$) parameters for a first bending part and a second bending part with respect to the pre-strain value of a three-dimensional photodetector according to an embodiment of the present disclosure.

Referring to FIG. 5B, it can be seen that, as the degree of pre-strain increases, the width ratio ($W_1$/$W_0$) of each of the first bending part and the second bending part decreases.

Figure 5C:
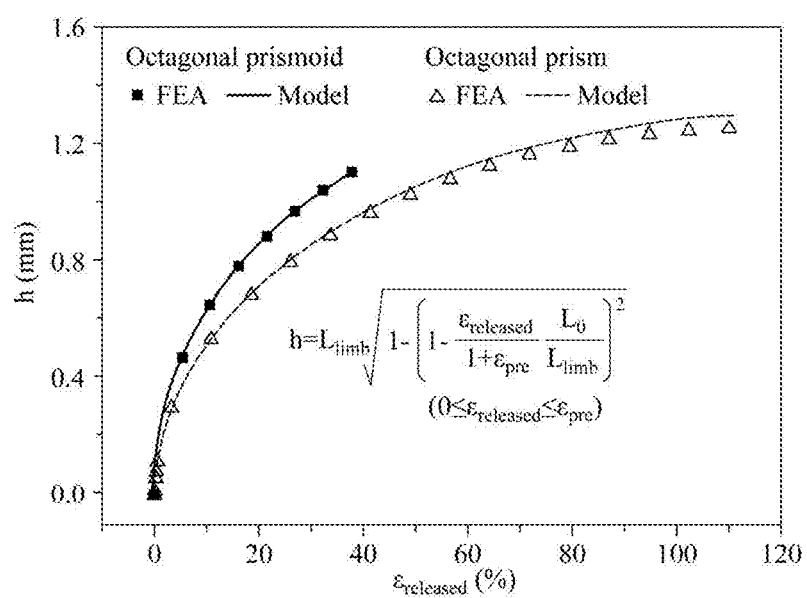
FIG. 5C is a graph showing FEA and analytical prediction results for deriving released pre-strains depending on the height (h) of a three-dimensional photodetector according to an embodiment of the present disclosure having an octagonal prismoid shape or an octagonal prism shape.

FIG. 5C is a graph showing FEA and analytical prediction results for deriving released pre-strains depending on the height (h) of a three-dimensional photodetector according to an embodiment of the present disclosure having an octagonal prismoid shape or an octagonal prism shape.

In FIG. 5C, the height (h) refers to a gap width between the base part and the stretchable substrate.

Referring to FIG. 5C, it can be seen that, as the degree of pre-strain relaxation increases, the height (h) increases.

Figure 5D:
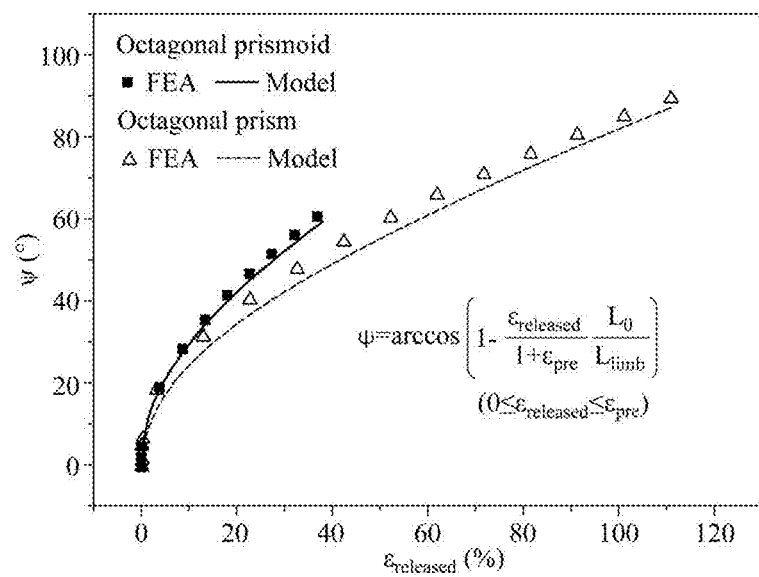
FIG. 5D is a graph showing FEA and analytical prediction results for deriving released pre-strains depending on the angle ($\Psi$) of a three-dimensional photodetector according to an embodiment of the present disclosure having an octagonal prismoid shape or an octagonal prism shape.

FIG. 5D is a graph showing FEA and analytical prediction results for deriving released pre-strains depending on the angle (Ψ) of a three-dimensional photodetector according to an embodiment of the present disclosure having an octagonal prismoid shape or an octagonal prism shape.

In FIG. 5D, the angle (P) refers to an angle between the stretchable substrate and the branch part.

Referring to FIG. 5D, it can be seen that, as the degree of pre-strain relaxation increases, the angle (Ψ) increases.

Referring to FIGS. 5a to 5e, it can be seen that a pre-strain value for forming a three-dimensional photodetector is controlled by the various geometric parameters of a two-dimensional photodetection structure.

Figure 6A:
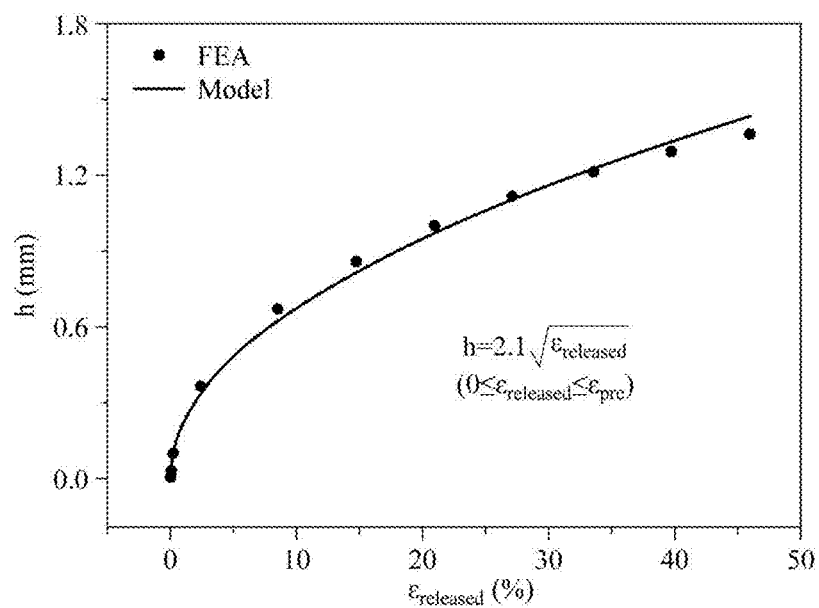
FIG. 6A is a graph showing FEA and analytical prediction results in consideration of the height of a three-dimensional photodetector according to an embodiment of the present disclosure as a function of released pre-strain, and FIG. 6B includes images respectively showing the mechanical assembly state at the intermediate step and the mechanical assembly state at the final step in manufacturing a three-dimensional photodetector according to an embodiment of the present disclosure.
Figure 6B:
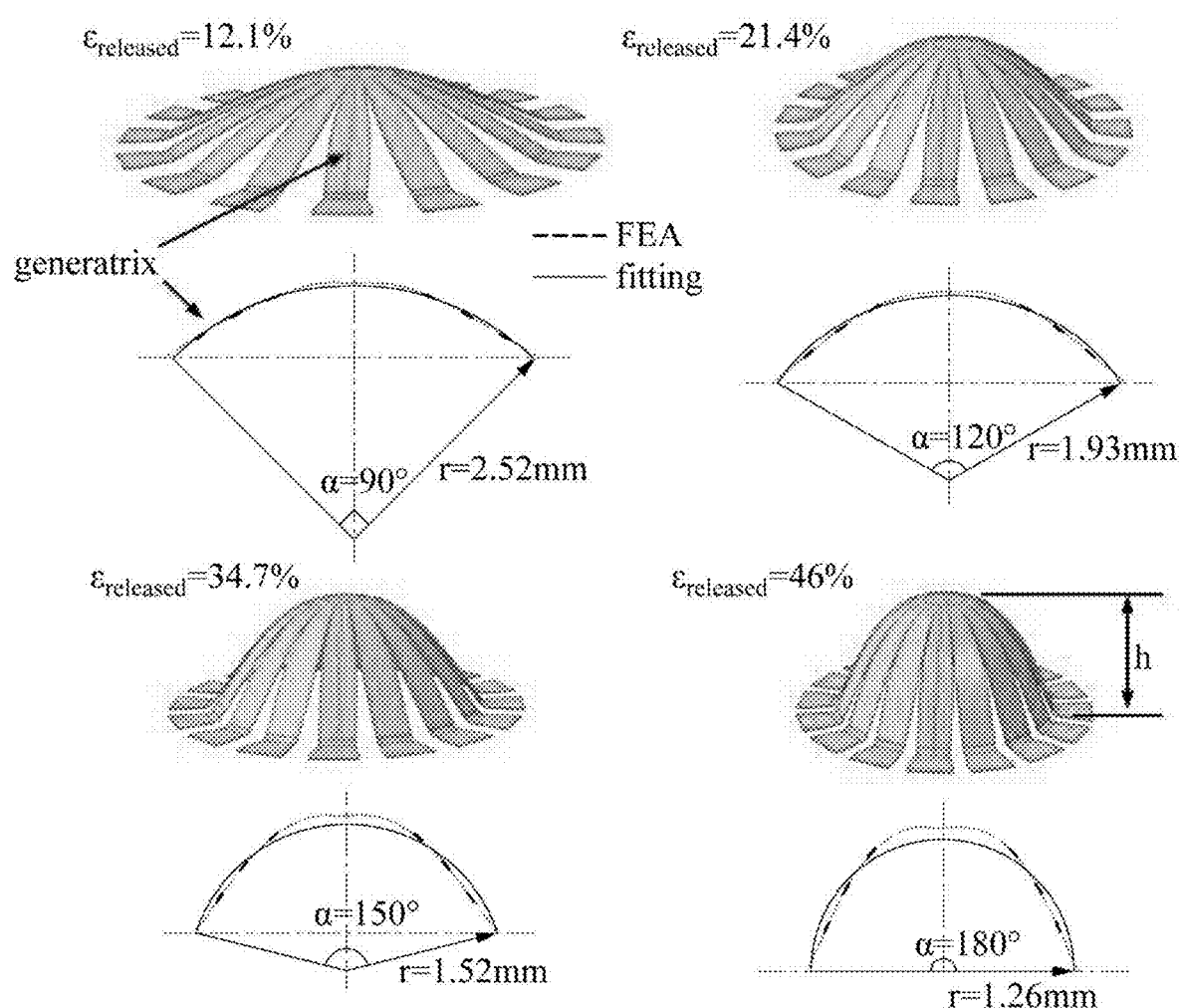

FIG. 6A is a graph showing FEA and analytical prediction results in consideration of the height of a three-dimensional photodetector according to an embodiment of the present disclosure as a function of released pre-strain, and FIG. 6B includes images respectively showing the mechanical assembly state at the intermediate step and the mechanical assembly state at the final step in manufacturing a three-dimensional photodetector according to an embodiment of the present disclosure.

Referring to FIGS. 6A and 6B, it can be seen that, as the degree of pre-strain relaxation increases, central angle gradually increases, reaching 180° in the final state. In addition, it can be seen that, as the degree of pre-strain relaxation increases, height (h) between the stretchable substrate and the base part increases.

Figure 7A:
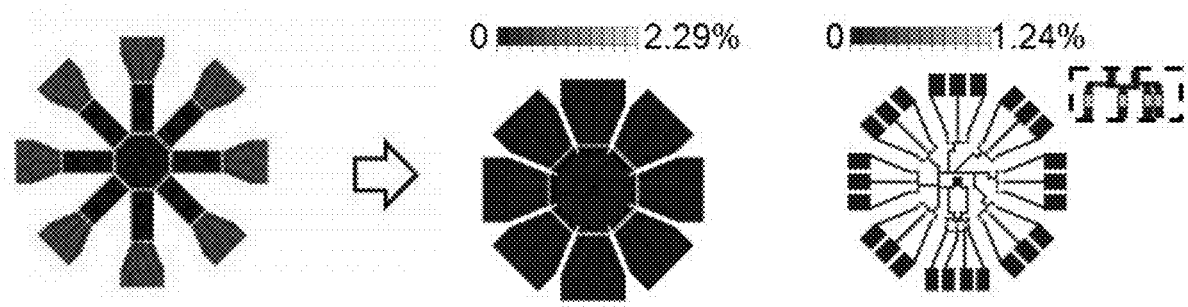
FIG. 7A includes images showing a maximum principal strain when the three-dimensional photodetector of an octagonal prism shape according to an embodiment of the present disclosure is viewed from the bottom, FIG. 7B includes images showing a maximum principal strain when the three-dimensional photodetector of an octagonal prismoid shape according to an embodiment of the present disclosure is viewed from the bottom, and FIG. 7C includes images showing a maximum principal strain when the three-dimensional photodetector of a hemispherical shape according to an embodiment of the present disclosure is viewed from the bottom.
Figure 7B:
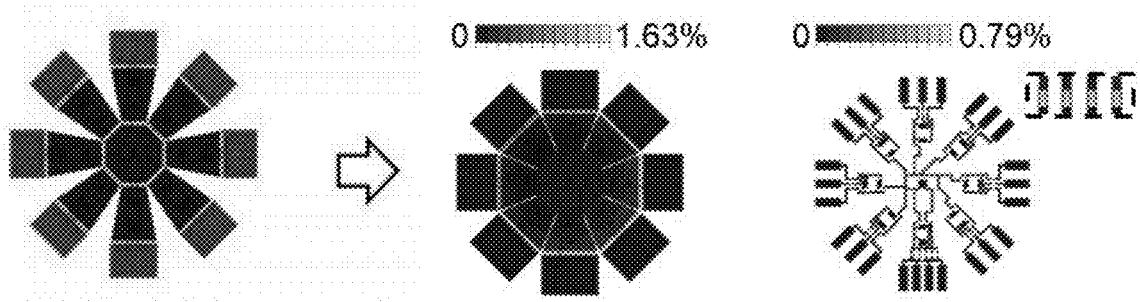
Figure 7C:
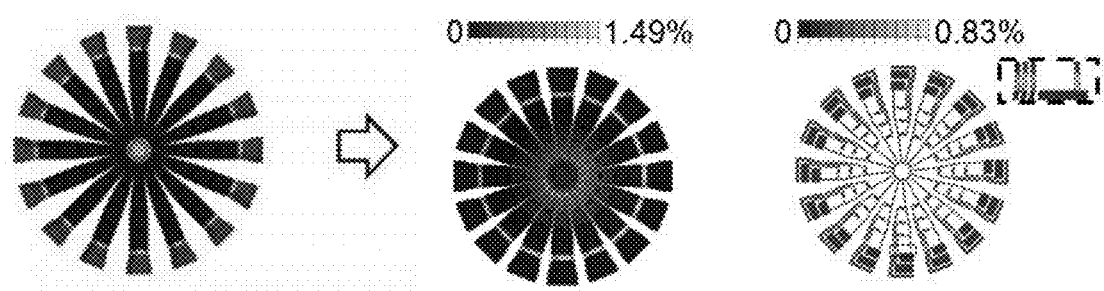

FIG. 7A includes images showing a maximum principal strain when the three-dimensional photodetector of an octagonal prism shape according to an embodiment of the present disclosure is viewed from the bottom, FIG. 7B includes images showing a maximum principal strain when the three-dimensional photodetector of an octagonal prismoid shape according to an embodiment of the present disclosure is viewed from the bottom, and FIG. 7C includes images showing a maximum principal strain when the three-dimensional photodetector of a hemispherical shape according to an embodiment of the present disclosure is viewed from the bottom.

Referring to FIGS. 7A to 7C, it can be seen that the peak value of the maximum principal strain of the three-dimensional photodetector according to an embodiment of the present disclosure appears at the second bending part.

In addition, in the three-dimensional photodetector according to an embodiment of the present disclosure, it can be seen that the strain of the second bending part reaches the peak value and the strain of each of the base part, the first bending part, the branch part, and the bonding part is very low.

In addition, it can be seen that the thickness/length ratio of the second bending part is smaller than that of each of the base part, the first bending part, the branch part, and the bonding part.

Figure 8:
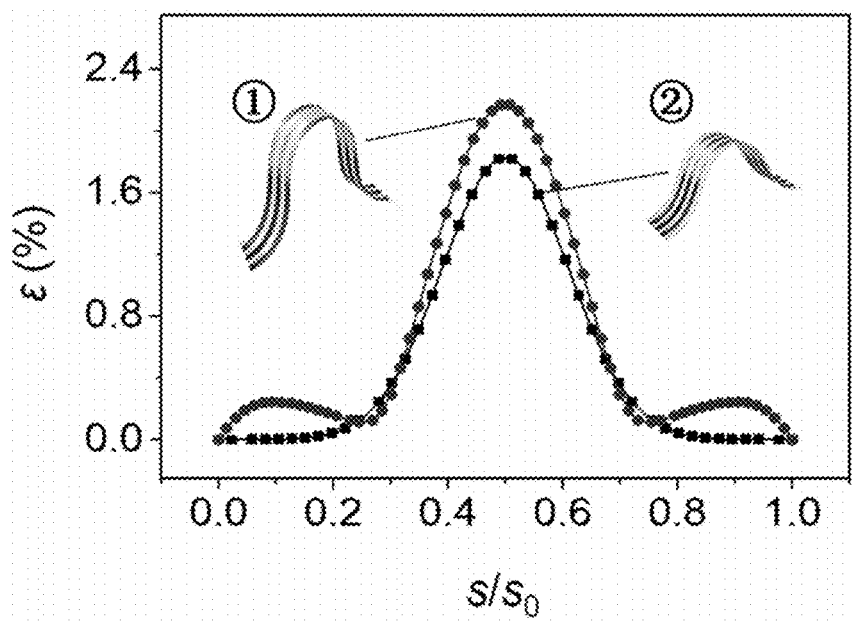
FIG. 8 is a graph showing the strain profiles of the interconnect of a three-dimensional photodetector according to an embodiment of the present disclosure.

FIG. 8 is a graph showing the strain profiles of the interconnect of a three-dimensional photodetector according to an embodiment of the present disclosure.

The three-dimensional photodetector according to an embodiment of the present disclosure may include an interconnect having a sandwich structure including a graphene bilayer between the first base material and the second base material.

It can be seen that the maximum strain of each of ① and ② located in the interconnect is much lower than the inherent elastic limit (6%) of graphene.

Figure 9A:
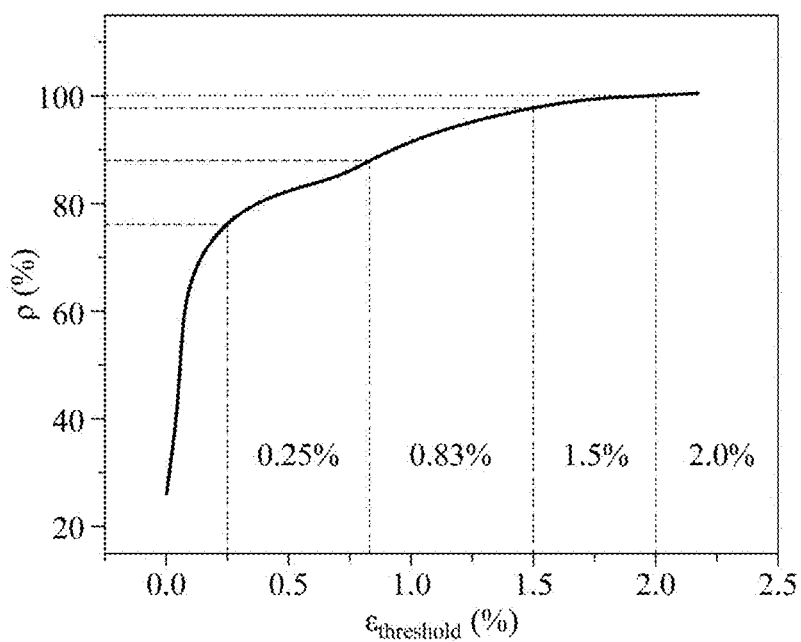
FIG. 9A is a graph showing the a real proportions of the interconnect of a three-dimensional photodetector according to an embodiment of the present disclosure depending on threshold values.
Figure 9B:
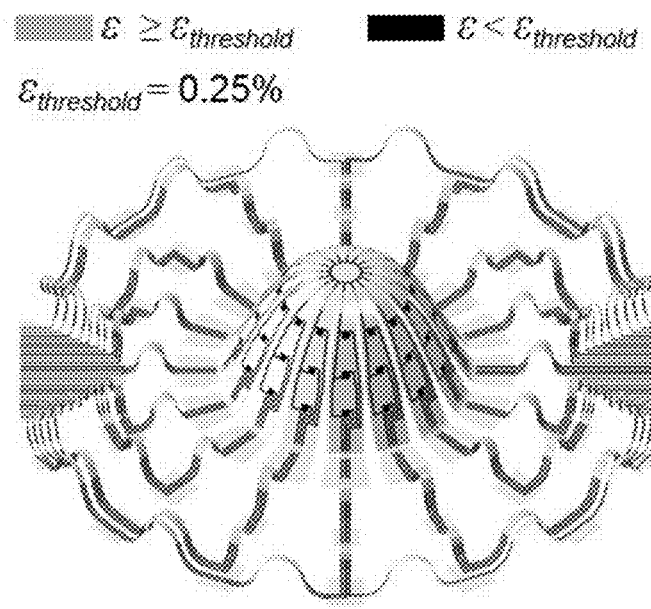
FIG. 9B is an image showing a three-dimensional photodetector according to an embodiment of the present disclosure having a threshold value of 0.25%.
Figure 9C:
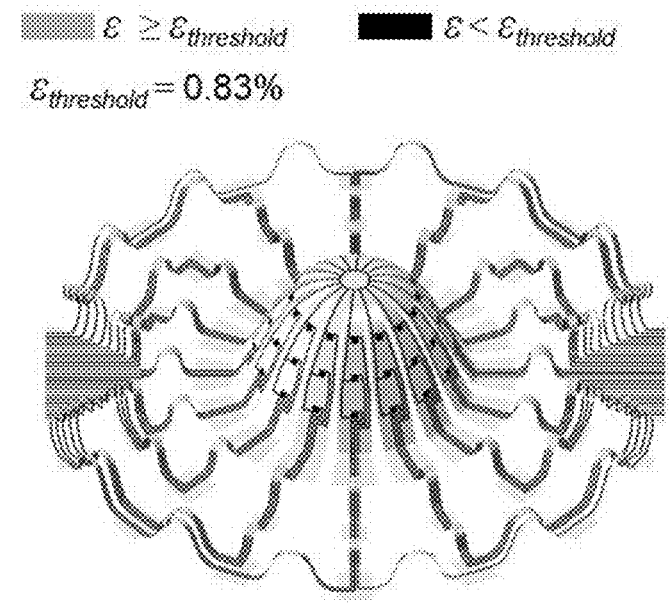
FIG. 9C is an image showing a three-dimensional photodetector according to an embodiment of the present disclosure having a threshold value of 0.83%.
Figure 9D:
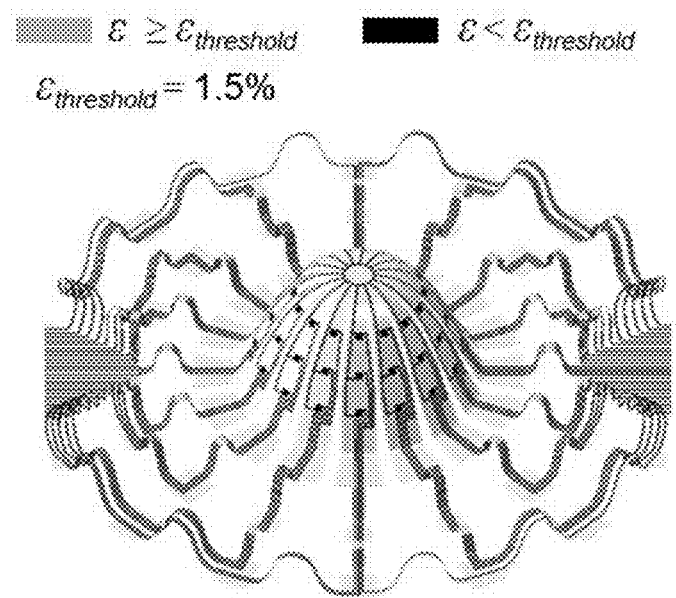
FIG. 9D is an image showing a three-dimensional photodetector according to an embodiment of the present disclosure having a threshold value of 1.5%.

FIG. 9A is a graph showing the areal proportions of the interconnect of a three-dimensional photodetector according to an embodiment of the present disclosure depending on threshold values, FIG. 9B is an image showing a three-dimensional photodetector according to an embodiment of the present disclosure having a threshold value of 0.25%, FIG. 9C is an image showing a three-dimensional photodetector according to an embodiment of the present disclosure having a threshold value of 0.83%, and FIG. 9D is an image showing a three-dimensional photodetector according to an embodiment of the present disclosure having a threshold value of 1.5%.

Referring to FIGS. 9A to 9D, it can be seen that the areal proportion of interconnects in a region with significant strain (>2%) is less than 0.2%.

Figure 10:
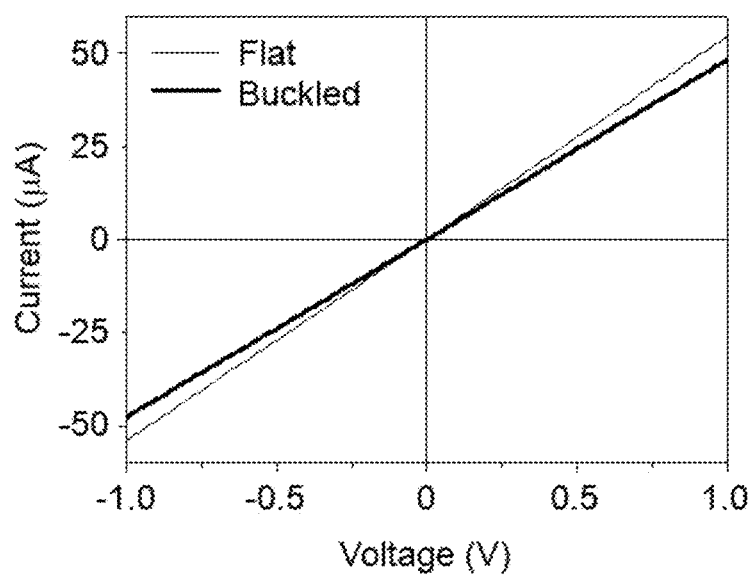
FIG. 10 is a graph showing the current-voltage (I-V) characteristics of a three-dimensional photodetector according to an embodiment of the present disclosure including an interconnect composed of flat graphene/first and second base materials and the current-voltage (I-V) characteristics of a three-dimensional photodetector according to an embodiment of the present disclosure including an interconnect composed of buckled graphene/first and second base materials.

FIG. 10 is a graph showing the current-voltage (I-V) characteristics of a three-dimensional photodetector according to an embodiment of the present disclosure including an interconnect composed of flat graphene/first and second base materials and the current-voltage (I-V) characteristics of a three-dimensional photodetector according to an embodiment of the present disclosure including an interconnect composed of buckled graphene/first and second base materials.

Referring to FIG. 10, the resistance of graphene in a region having the minimum bending radius (a part where strain is maximized to 2.17%) is ~20.7 kΩ, and the resistance of a three-dimensional photodetector according to an embodiment of the present disclosure including interconnects composed of flat graphene/first and second base materials is ~18.3 kΩ.

Figure 11:
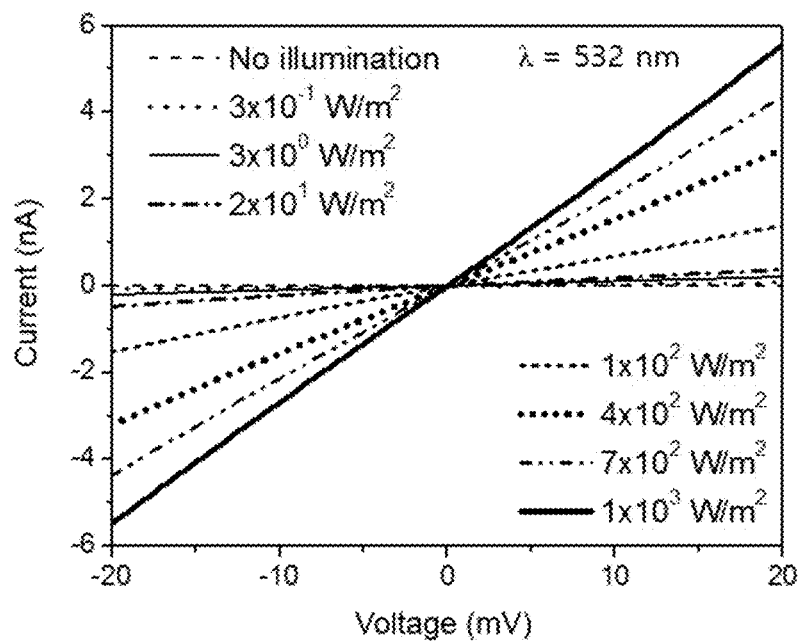
FIG. 11 is a graph showing the current-voltage (I-V) characteristics of a photoresistor included in a three-dimensional photodetector according to an embodiment of the present disclosure in a low voltage range of −20 mV to 2 mV.

FIG. 11 is a graph showing the current-voltage (I-V) characteristics of a photoresistor included in a three-dimensional photodetector according to an embodiment of the present disclosure in a low voltage range of −20 mV to 2 mV.

Referring to FIG. 11, it can be seen that linear behavior and symmetrical current-voltage (I-V) characteristics correspond to ohmic contact between graphene and molybdenum disulfide ($MoS_2$).

Figure 12:
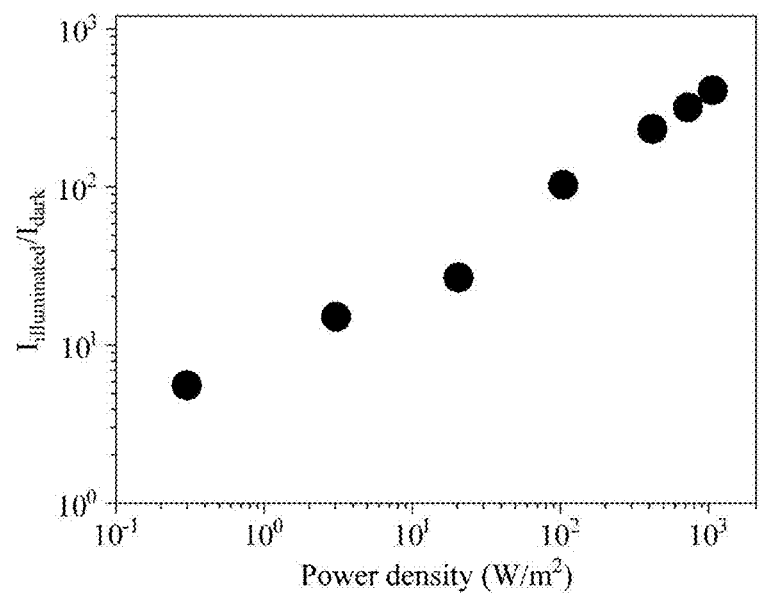
FIG. 12 is a graph showing current ratios between the dark state and the illuminated state of a photoresistor included in a three-dimensional photodetector according to an embodiment of the present disclosure specified at different laser power densities.

FIG. 12 is a graph showing current ratios between the dark state and the illuminated state of a photoresistor included in a three-dimensional photodetector according to an embodiment of the present disclosure specified for different laser power densities.

Referring to FIG. 12, it can be seen that the maximum ratio of photocurrent (Iph) under dark and illuminated conditions reaches ~427 at an intensity of $10^3$ W/m$^2$.

Figure 13:
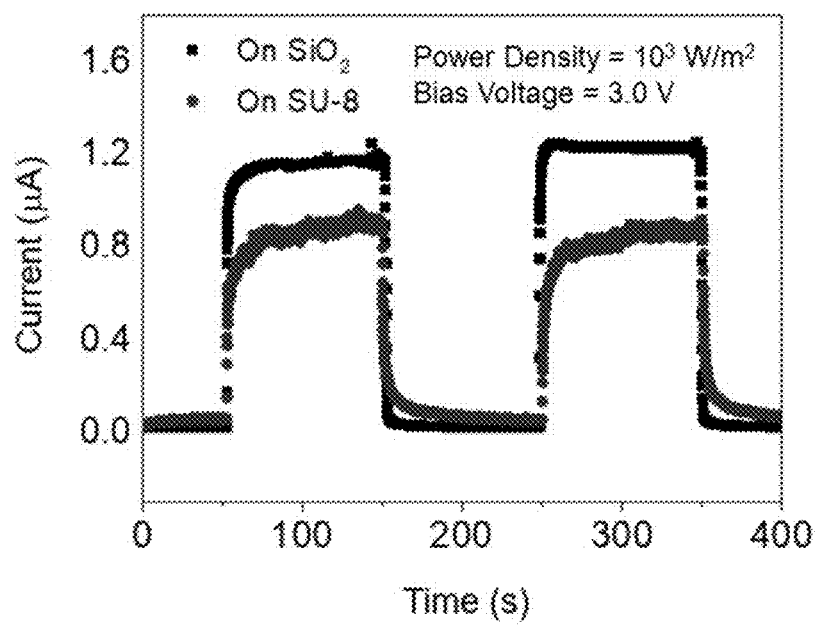
FIG. 13 is a graph showing the time-resolved photoresponse results of a photoresistor, which includes first and second base materials of silicon oxide ($SiO_2$) and is included in a three-dimensional photodetector according to an embodiment of the present disclosure, and the time-resolved photoresponse results of a photoresistor, which includes first and second base materials of SU-8 and is included in a three-dimensional photodetector according to an embodiment of the present disclosure.

FIG. 13 is a graph showing the time-resolved photoresponse results of a photoresistor, which is formed on silicon oxide ($SiO_2$) and is included in a three-dimensional photodetector according to an embodiment of the present disclosure, and the time-resolved photoresponse results of a photoresistor, which is formed on SU-8 and is included in a three-dimensional photodetector according to an embodiment of the present disclosure.

Referring to FIG. 13, it can be seen that, since the number of surface traps at the interface of $MoS_2/SiO_2$ is larger than the number of surface traps at the interface of $MoS_2$/SU-8, the time-resolved photoresponse of a photoresistor included in a three-dimensional photodetector according to an embodiment of the present disclosure formed on SU-8 is lower than that of a photoresistor included in a three-dimensional photodetector according to an embodiment of the present disclosure formed on silicon oxide ($SiO_2$).

Figure 14A:
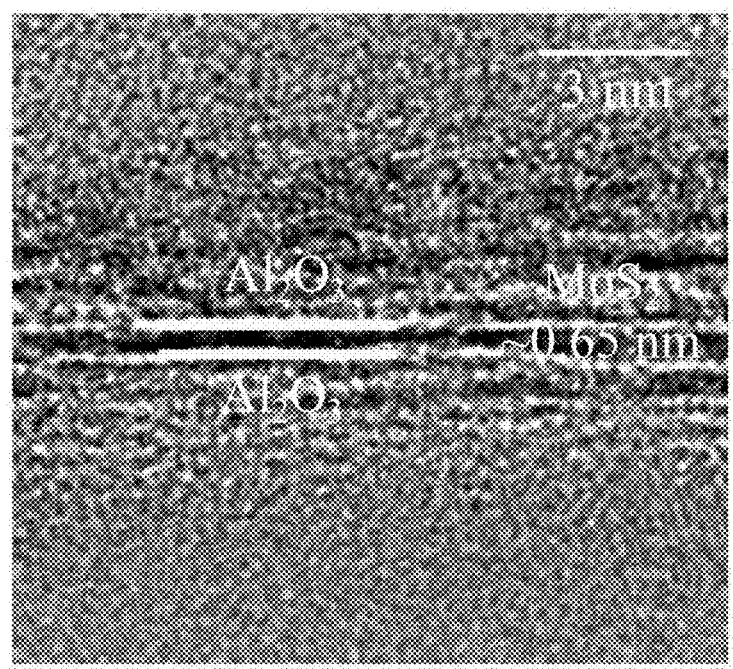
FIG. 14A is a transmission electron microscope image showing a photoresistor, which includes a first protective layer and a second protective layer and is included in a three-dimensional photodetector according to an embodiment of the present disclosure.

FIG. 14A is a transmission electron microscope (TEM) image showing a photoresistor included in a three-dimensional photodetector according to an embodiment of the present disclosure, wherein the photoresistor includes a first protective layer and a second protective layer.

Referring to FIG. 14A, it can be seen that the first protective layer ($Al_2O_3$), the two-dimensional transition metal chalcogen compound channel ($MoS_2$), and the second protective layer ($Al_2O_3$) are formed in a sandwich structure.

Figure 14B:
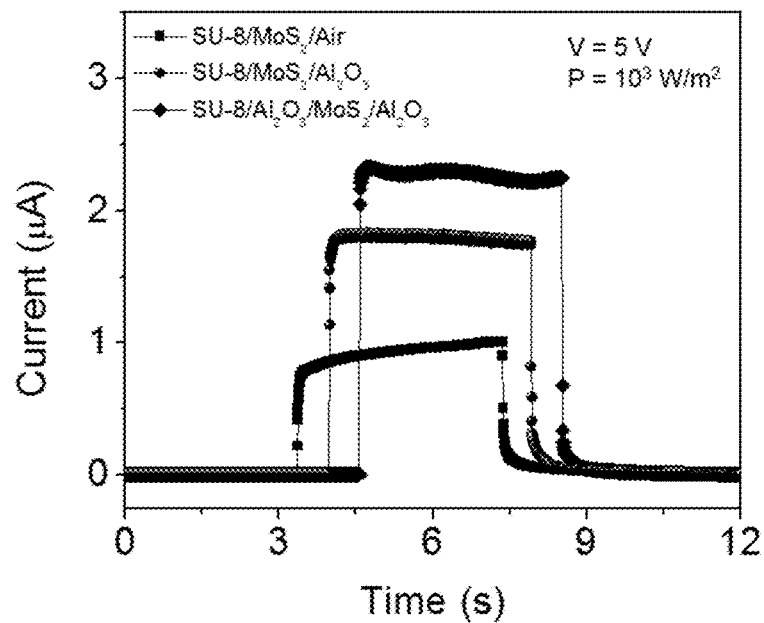
FIG. 14B is a graph showing the photoresponse results of a photoresistor (SU-8/$MoS_2$/Air) included in a three-dimensional photodetector according to an embodiment of the present disclosure, wherein the photoresistor does not include a first protective layer and a second protective layer; a photoresistor (SU-8/$MoS_2$/$Al_2O_3$) included in a three-dimensional photodetector according to an embodiment of the present disclosure, wherein the photoresistor includes a first protective layer; and a photoresistor (SU-8/$Al_2O_3$/$MoS_2$/$Al_2O_3$) included in a three-dimensional photodetector according to an embodiment of the present disclosure, wherein the photoresistor includes a first protective layer and a second protective layer.

FIG. 14B is a graph showing the photoresponse results of a photoresistor (SU-8/$MoS_2$/Air) included in a three-dimensional photodetector according to an embodiment of the present disclosure, wherein the photoresistor does not include a first protective layer and a second protective layer; a photoresistor (SU-8/$MoS_2$/$Al_2O_3$) included in a three-dimensional photodetector according to an embodiment of the present disclosure, wherein the photoresistor includes a first protective layer; and a photoresistor (SU-8/$Al_2O_3$/$MoS_2$/$Al_2O_3$) included in a three-dimensional photodetector according to an embodiment of the present disclosure, wherein the photoresistor includes a first protective layer and a second protective layer.

Figure 14C:
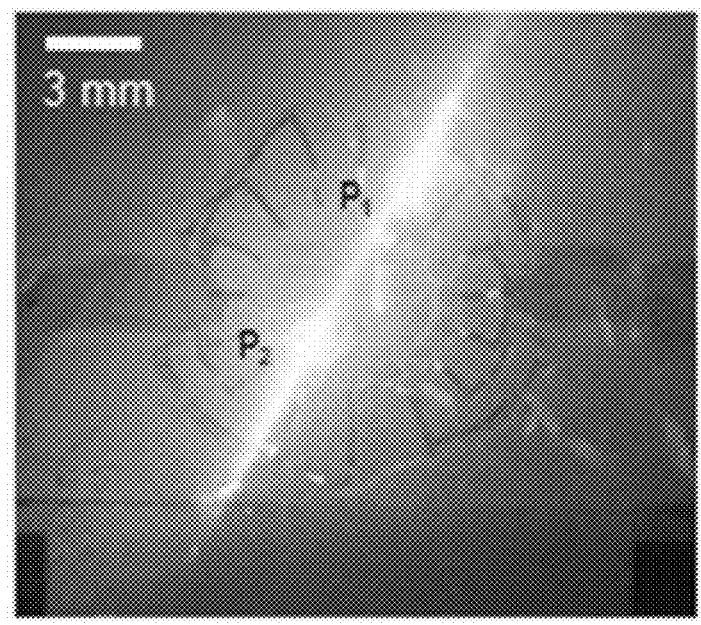
FIG. 14C is an optical image of a three-dimensional photodetector according to an embodiment of the present disclosure including photoresistors including a first protective layer and a second protective layer.
Figure 14D:
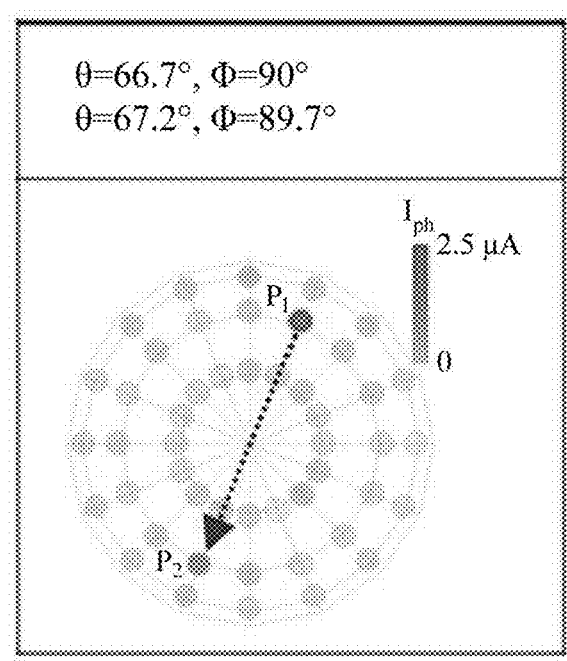
FIG. 14D is a photoimage of a three-dimensional photodetector according to an embodiment of the present disclosure including photoresistors including a first protective layer and a second protective layer.

FIG. 14C is an optical image of a three-dimensional photodetector according to an embodiment of the present disclosure including photoresistors including a first protective layer and a second protective layer, and FIG. 14D is a photoimage of a three-dimensional photodetector according to an embodiment of the present disclosure including photoresistors including a first protective layer and a second protective layer.

Referring to FIGS. 14A to 14D, the first protective layer ($Al_2O_3$) and the second protective layer ($Al_2O_3$) reduce the surface roughness of the two-dimensional transition metal chalcogen compound channel ($MoS_2$), and provide clean and conformal contact, thereby reducing traps at the interface of the two-dimensional transition metal chalcogen compound channel ($MoS_2$).

In addition, by providing a high dielectric dissimilarity between the two-dimensional transition metal chalcogen compound channel ($MoS_2$) and the first protective layer ($Al_2O_3$) and the second protective layer ($Al_2O_3$) using a high-k dielectric material as the first protective layer ($Al_2O_3$) and the second protective layer ($Al_2O_3$), generation of Coulombic impurities at the interface of the two-dimensional transition metal chalcogen compound channel ($MoS_2$) may be prevented, and transmission of carrier traps may be reduced.

Therefore, when the three-dimensional photodetector according to an embodiment of the present disclosure including photoresistors including a first protective layer and a second protective layer is used, carrier transfer according to light is accelerated, and response speed may be increased.

The response speed of a photoresistor included in a three-dimensional photodetector according to an embodiment of the present disclosure, wherein the photoresistor includes a first protective layer and a second protective layer, was measured, and the results are shown in Table 1 below.

TABLE 1

| | $\tau_{rise}$ (ms) | $\tau_{decay}$ (ms) |
|---|---|---|
| SU-8/$MoS_2$/Air | 176.7 ± 95.4 | 264.9 ± 120.7 |
| SU-8/$MoS_2$/$Al_2O_3$ | 29.52 ± 17.4 | 51.66 ± 22.7 |
| SU-8/$Al_2O_3$/$MoS_2$/$Al_2O_3$ | 7.3 ± 4.2 | 14.7 ± 7.5 |

Referring to Table 1, it can be seen that the rise time ($\tau_{rise}$) and decay time ($\tau_{decay}$) of the photoresistor (SU-8/$Al_2O_3$/$MoS_2$/$Al_2O_3$) included in a three-dimensional photodetector according to an embodiment of the present disclosure, wherein the photoresistor includes a first protective layer and a second protective layer, are 20 times greater than those of a photoresistor (SU-8/$MoS_2$/Air) included in a three-dimensional photodetector according to an embodiment of the present disclosure, wherein the photoresistor does not include a first protective layer and a second protective layer.

Therefore, it can be seen that the response speed of a photoresistor included in a three-dimensional photodetector according to an embodiment of the present disclosure is increased by the first protective layer and the second protective layer.

Figure 15:
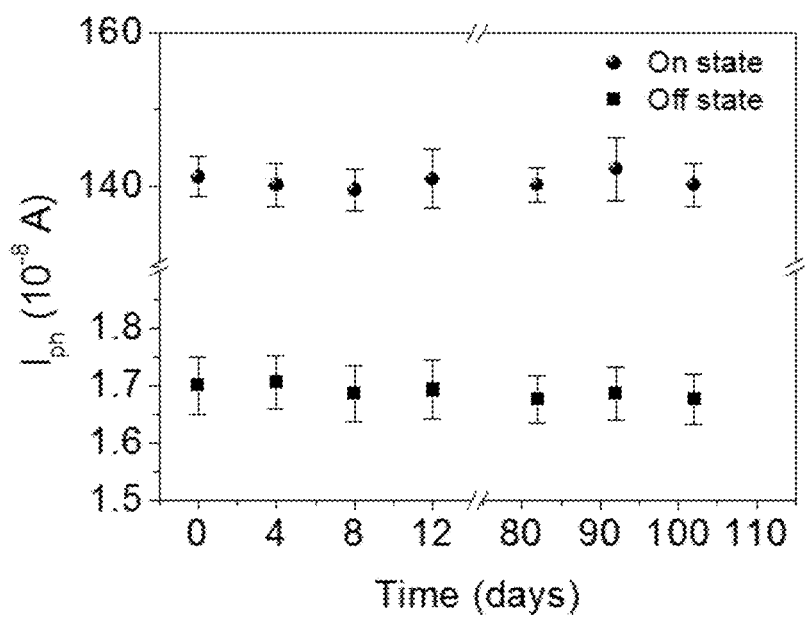
FIG. 15 is a graph showing the stability test results of a three-dimensional photodetector according to an embodiment of the present disclosure.

FIG. 15 is a graph showing the stability test results of a three-dimensional photodetector according to an embodiment of the present disclosure.

Referring to FIG. 15, it can be seen that dark current and photoresponse are stable for more than three months, and excellent environmental stability is exhibited, and stable operation depends on two-dimensional materials.

Figure 16A:
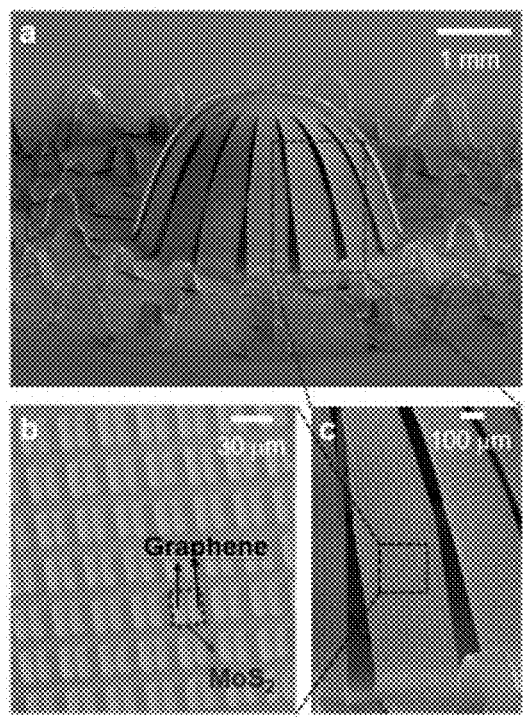
FIG. 16A includes scanning electron microscope (SEM) images showing a three-dimensional photodetector according to an embodiment of the present disclosure.
Figure 16B:
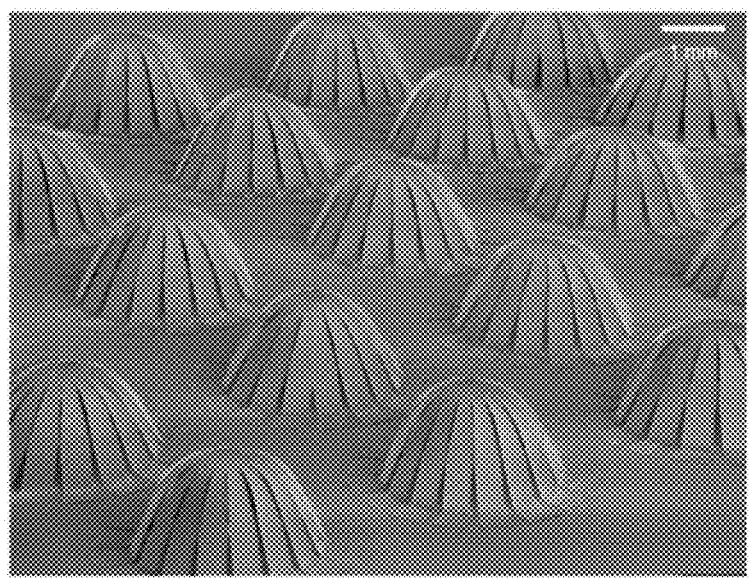
FIG. 16B is a scanning electron microscope (SEM) image showing the 5×5 array structure of a three-dimensional photodetector according to an embodiment of the present disclosure.

FIG. 16A includes scanning electron microscope (SEM) images showing a three-dimensional photodetector according to an embodiment of the present disclosure, and FIG. 16B is a scanning electron microscope (SEM) image showing the 5×5 array structure of a three-dimensional photodetector according to an embodiment of the present disclosure.

Referring to FIG. 16A, it can be seen that the three-dimensional photodetector according to an embodiment of the present disclosure includes 10,000 photoresistors, and more specifically, ~6,000 photoresistors per 16 branch parts are included.

Referring to FIG. 16B, it can be seen that the three-dimensional photodetector according to an embodiment of the present disclosure has an array structure in which at least one three-dimensional photodetector is formed on a stretchable substrate.

Figure 17:
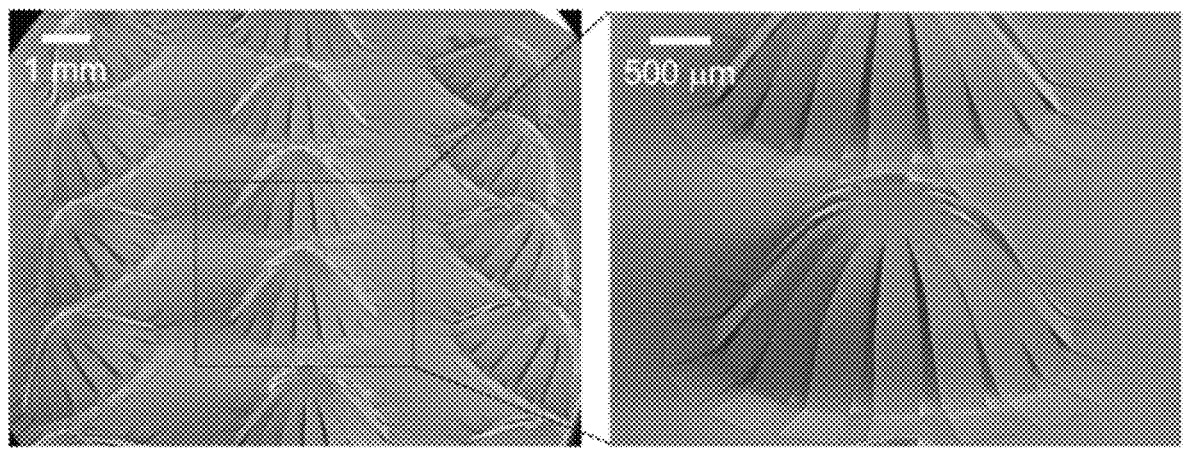
FIG. 17 includes scanning electron microscope (SEM) images showing a three-dimensional photodetector according to an embodiment of the present disclosure according to non-destructive strain.

FIG. 17 includes scanning electron microscope (SEM) images showing a three-dimensional photodetector according to an embodiment of the present disclosure according to non-destructive strain.

Referring to FIG. 17, it can be seen that, since the three-dimensional photodetector according to an embodiment of the present disclosure has mechanical flexibility, the three-dimensional photodetector exhibits high stability in bending operation, stretching operation, and twisting operation.

FIG. 18A to FIG. 18D include scanning electron microscope (SEM) images showing a three-dimensional photodetector according to an embodiment of the present disclosure according to different in-plane biaxial stretching states.

Referring to FIGS. 18A to 18D, it can be seen that the 5×5 array of the three-dimensional photodetector according to an embodiment of the present disclosure is uniformly stretched in the transverse direction through reduction in height. In addition, height before and after stretching (FIGS. 18A and 18D) is the same, indicating that the array is restored to original dimensions thereof after stretching.

Figure 18A:
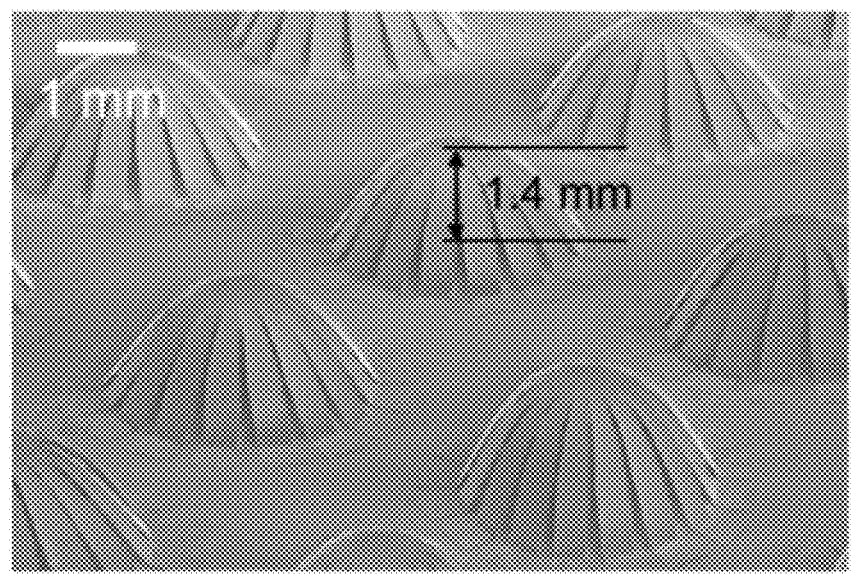
FIG. 18A to FIG. 18D include scanning electron microscope (SEM) images showing a three-dimensional photodetector according to an embodiment of the present disclosure according to different in-plane biaxial stretching states.
Figure 18B:
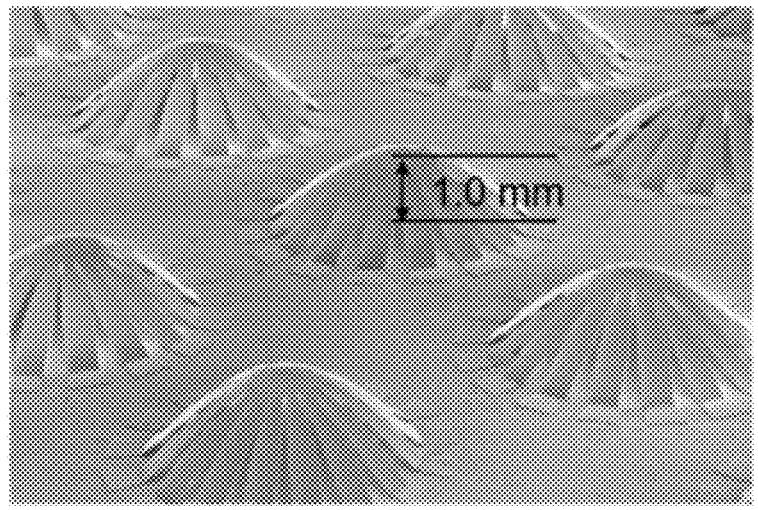
Figure 18C:
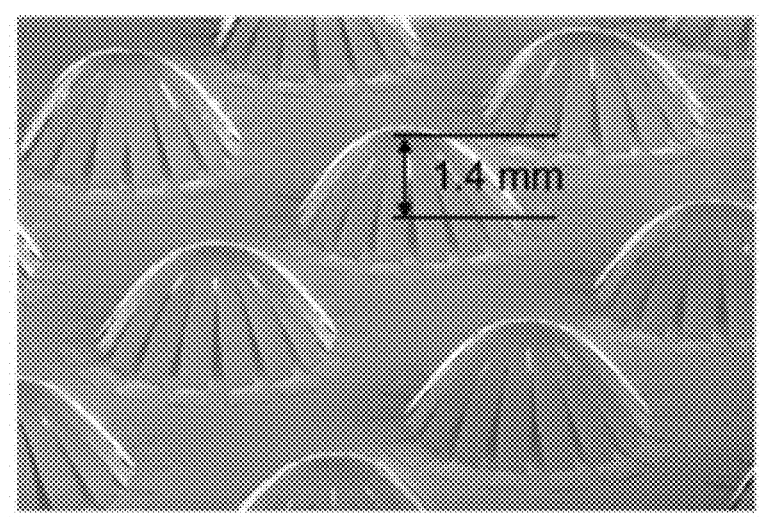
Figure 18D:
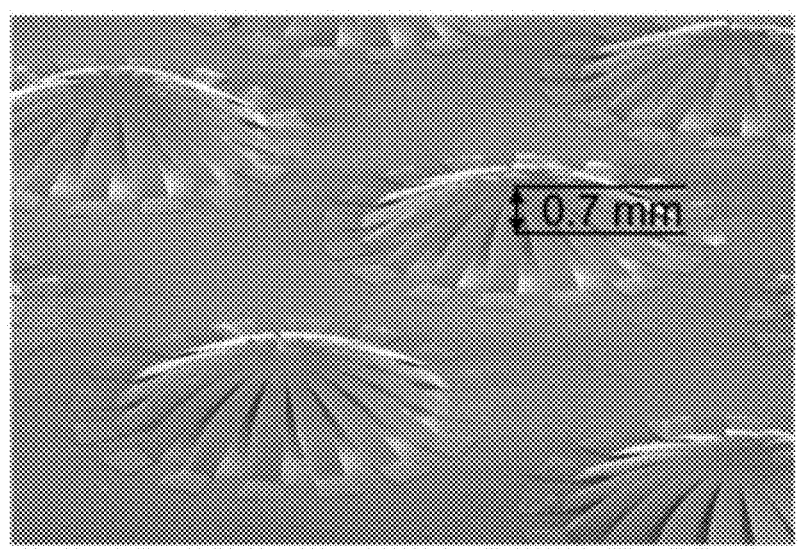

In addition, referring to FIGS. 18A and 18D, in the three-dimensional photodetector according to an embodiment of the present disclosure, cracking and flaking do not occur during repeated stretching, indicating that the three-dimensional photodetector has excellent mechanical robustness.

Figure 19:
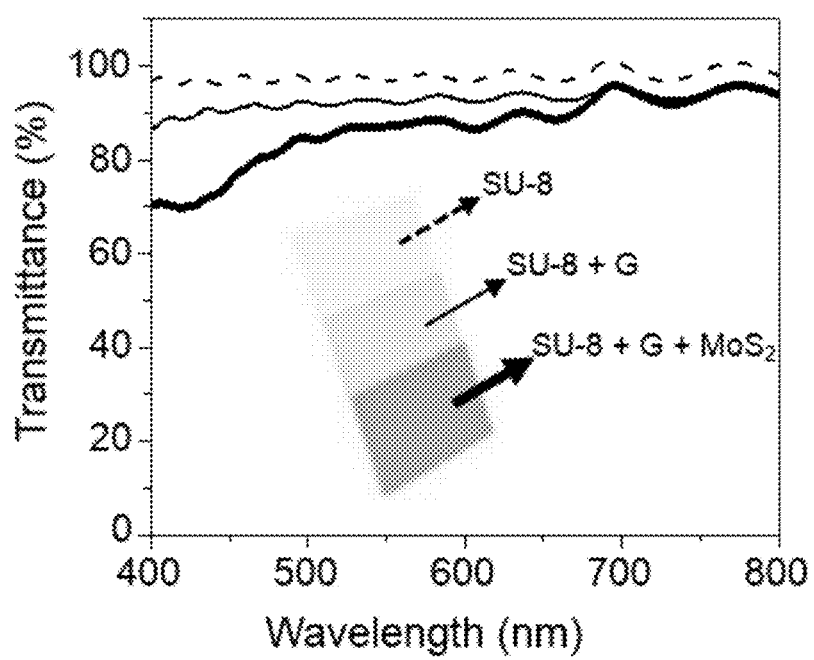
FIG. 19 is a graph showing spectrum results showing the transmittance of a three-dimensional photodetector according to an embodiment of the present disclosure depending on wavelength.

FIG. 19 is a graph showing spectrum results showing the transmittance of a three-dimensional photodetector according to an embodiment of the present disclosure depending on wavelength.

Referring to FIG. 19, it can be seen that, since the photoresistor included in the three-dimensional photodetector according to an embodiment of the present disclosure includes bilayer graphene, single layer molybdenum disulfide, and SU-8 having a thickness of 5 to 7 µm, the three-dimensional photodetector exhibits a high light transmittance of ~87% at 550 nm.

Figure 20A:
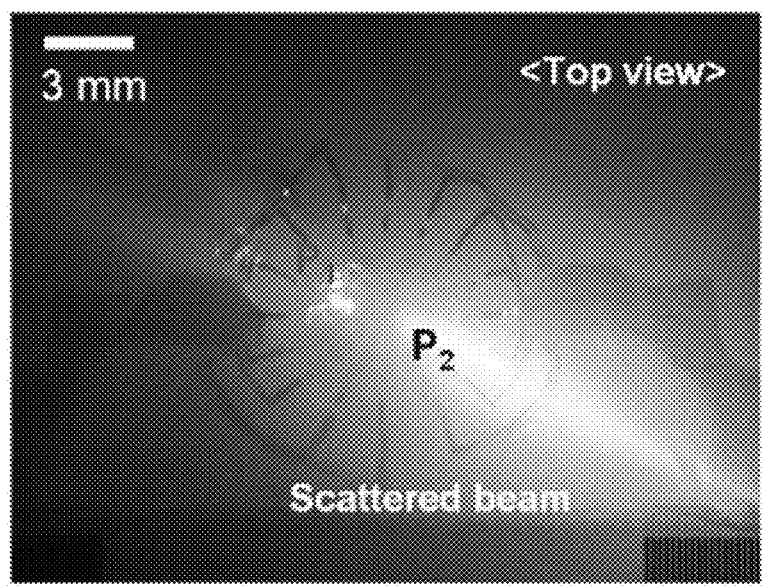
FIG. 20A is an optical image showing a state in which the position and direction of an incident laser beam is being identified in a three-dimensional photodetector according to an embodiment of the present disclosure, FIG. 20B includes diagrams showing a state in which the position and direction of an incident laser beam are being identified in a three-dimensional photodetector according to an embodiment of the present disclosure and graphs showing photoresponse and intensity distribution, and FIG. 20C schematically illustrates conditions for increasing light scattering.
Figure 20B:
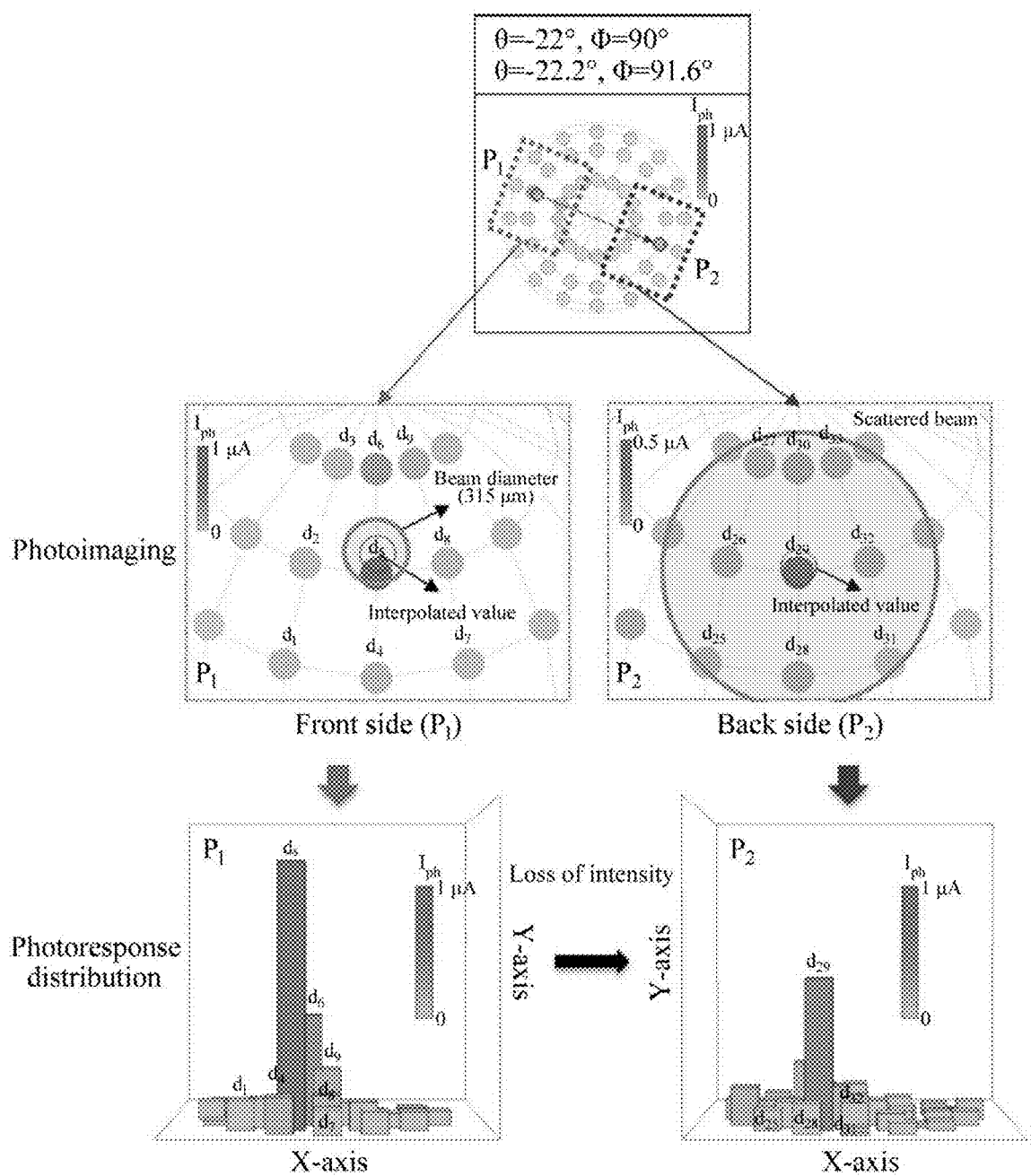
Figure 20C:
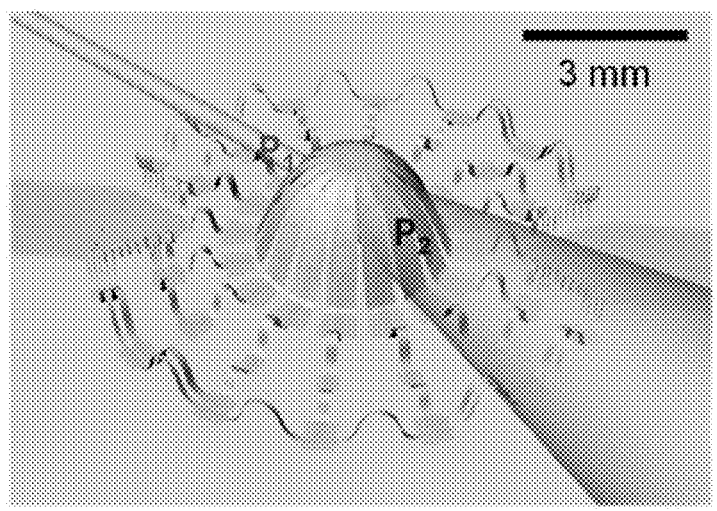

FIG. 20A is an optical image showing a state in which the position and direction of an incident laser beam are being identified in a three-dimensional photodetector according to an embodiment of the present disclosure, FIG. 20B includes diagrams showing a state in which the position and direction of an incident laser beam are being identified in a three-dimensional photodetector according to an embodiment of the present disclosure and graphs showing photoresponse and intensity distribution, and FIG. 20C schematically illustrates conditions for increasing light scattering.

Referring to FIGS. 20A to 20C, it can be seen that scattering greatly affects photoresistors adjacent to the position where a laser beam enters the three-dimensional photodetector according to an embodiment of the present disclosure and the position where a laser beam exits the three-dimensional photodetector.

Referring to FIGS. 20A to 20C, since only nine photoresistors closest to illuminated points respond to optical signals, the position of incident light may be calculated from the coordinates (for the center of a hemispherical shape) of the nine photoresistors (see Equation 1).

$$P_I(\theta_I, \varphi_I) = \left( \sum_1^9 \left( \theta_n * \frac{I_{ph,n}}{\sum I_n} \right), \sum_1^9 \left( \varphi_n * \frac{I_{ph,n}}{\sum I_n} \right) \right) \quad \text{[Equation 1]}$$

$P_I$ is the spherical coordinate of an incident point, $I_{ph}$ is the photocurrent of an $n^{th}$ photoresistor, $\varphi$ is polar angle, and $\theta$ is azimuth angle.

In addition, in the three-dimensional photodetector according to an embodiment of the present disclosure, as a laser beam moves, orbit thereof may be calculated from the initial point and recorded.

Referring to FIGS. 20A to 20C, among nine photoresistors considered to identify the position and orientation of a laser beam, only d5 of P1 and d29 of P2 respond to incident light, while the remaining photoresistors respond only to scattered light.

Figure 23A:
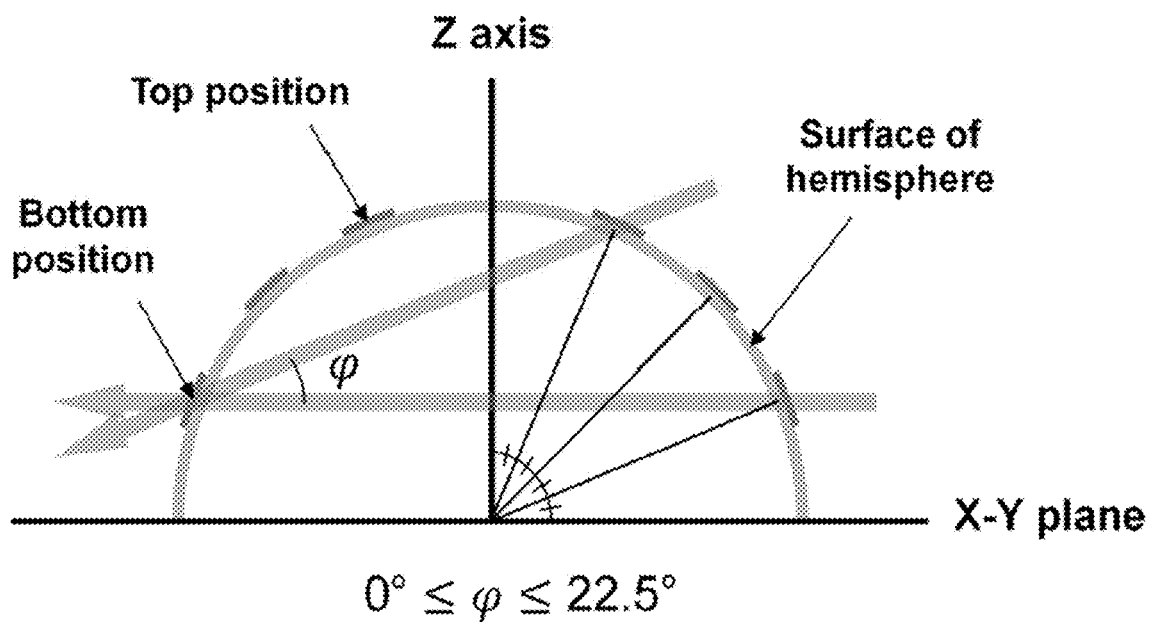
FIG. 23A is a schematic diagram showing that a three-dimensional photodetector according to an embodiment of the present disclosure can detect a polar angle ($\varphi$) of 0° to 25°.
Figure 23B:
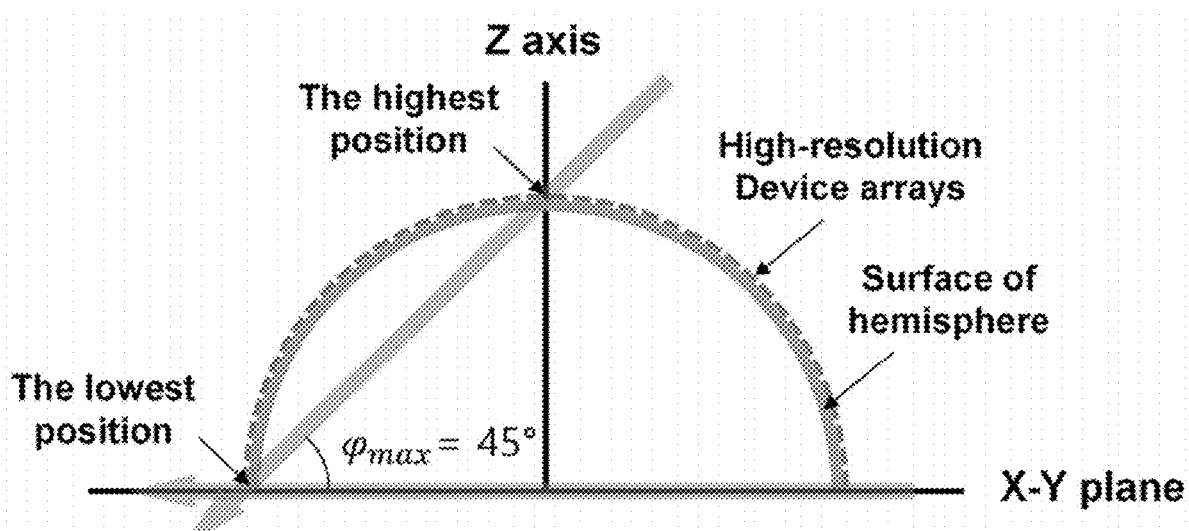
FIG. 23B is a schematic diagram showing that a three-dimensional photodetector according to an embodiment of the present disclosure has a maximum sensing azimuth angle ($\theta$) of 45°.

In addition, since intensity of light is lost when incident light passes through the three-dimensional photodetector, photoresponse at P2 is reduced as compared with photoresponse at P1.

the present disclosure can detect a polar angle ($\varphi$) of 0° to 25°, and FIG. 23B is a schematic diagram showing that a three-dimensional photodetector according to an embodiment of the present disclosure has a maximum sensing azimuth angle ($\theta$) of 45°.

Referring to FIG. 23A, it can be seen that, even when the three-dimensional photodetector according to an embodiment of the present disclosure is capable of mapping azimuth angle to 360°, polar angle ($\varphi$) is limited to arrangement of photoresistors.

However, referring to FIG. 23B, by adjusting arrangement by increasing the number of photoresistors included in the three-dimensional photodetector according to an embodiment of the present disclosure, polar angle ($\varphi$) may be measured up to 45°.

Figure 24:
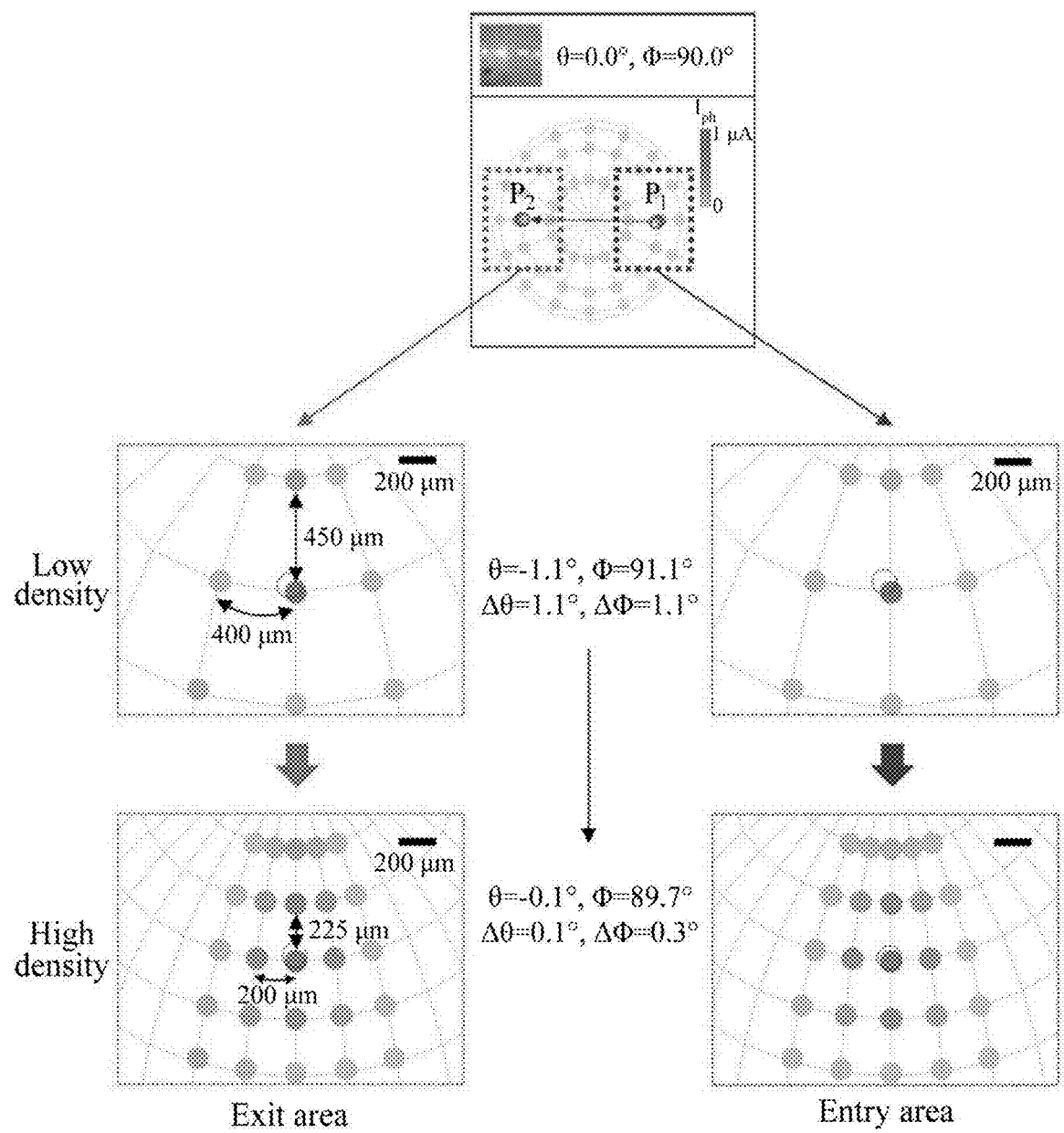
FIG. 24 includes images showing distance relationships between photoresistors included in a three-dimensional photodetector according to an embodiment of the present disclosure.

FIG. 24 include images showing distance relationships between photoresistors included in a three-dimensional photodetector according to an embodiment of the present disclosure.

In FIG. 24, a low density array and a high density array were compared. Distance between photoresistors in the high density array is half distance between photoresistors in the low density array.

Deviation between a measured laser beam position and an actual position is shown in Table 2.

TABLE 2

| Reference angle | $\theta = -45.0°$<br>$\varphi = 90.0°$ | $\theta = 0.0°$<br>$\varphi = 90.0°$ | $\theta = 45.0°$<br>$\varphi = 90.0°$ | $\theta = 0.0°$<br>$\varphi = 90.0°$ | $\theta = 0.0°$<br>$\varphi = 78.7°$ | $\theta = 0.0°$<br>$\varphi = 67.5°$ | $\theta = 45.0°$<br>$\varphi = 67.5°$ | $\theta = 90.0°$<br>$\varphi = 90.0°$ | $\theta = 135°$<br>$\varphi = 112.5°$ | Average deviation |
|---|---|---|---|---|---|---|---|---|---|---|
| Low density | $\Delta\theta = 0.0°$<br>$\Delta\varphi = 0.3°$ | $\Delta\theta = 1.1°$<br>$\Delta\varphi = 1.1°$ | $\Delta\theta = 0.7°$<br>$\Delta\varphi = 1.3°$ | $\Delta\theta = 0.7°$<br>$\Delta\varphi = 0.5°$ | $\Delta\theta = 0.1°$<br>$\Delta\varphi = 1.4°$ | $\Delta\theta = 0.4°$<br>$\Delta\varphi = 1.3°$ | $\Delta\theta = 0.3°$<br>$\Delta\varphi = 1.7°$ | $\Delta\theta = 0.5°$<br>$\Delta\varphi = 0.4°$ | $\Delta\theta = 0.5°$<br>$\Delta\varphi = 1.4°$ | $\Delta\theta = 0.5°$<br>$\Delta\varphi = 1.0°$ |
| High density | $\Delta\theta = 0.1°$<br>$\Delta\varphi = 0.1°$ | $\Delta\theta = 0.1°$<br>$\Delta\varphi = 0.3°$ | $\Delta\theta = 0.1°$<br>$\Delta\varphi = 0.1°$ | $\Delta\theta = 0.2°$<br>$\Delta\varphi = 0.3°$ | $\Delta\theta = 0.1°$<br>$\Delta\varphi = 1.2°$ | $\Delta\theta = 0.1°$<br>$\Delta\varphi = 1.1°$ | $\Delta\theta = 0.1°$<br>$\Delta\varphi = 1.4°$ | $\Delta\theta = 0.1°$<br>$\Delta\varphi = 0.1°$ | $\Delta\theta = 0.1°$<br>$\Delta\varphi = 1.2°$ | $\Delta\theta = 0.1°$<br>$\Delta\varphi = 0.6°$ |

Therefore, although the transmittance of a three-dimensional photodetector is a very important factor, the three-dimensional photodetector according to an embodiment of the present disclosure has a relatively low rate of reduction in photoresponse because the three-dimensional photodetector has a high transmittance.

Figure 21A:
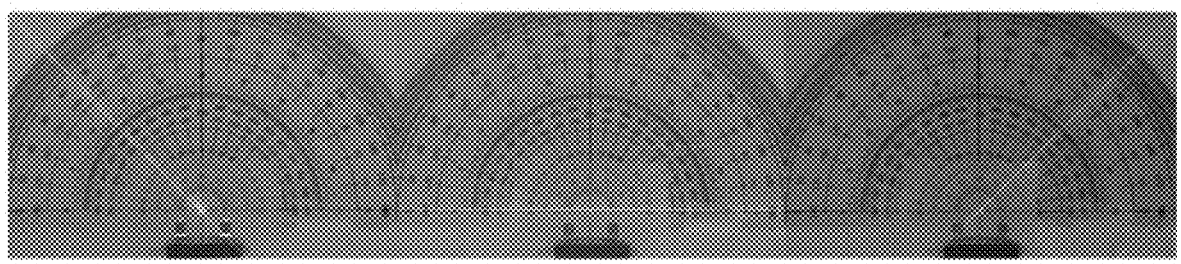
FIG. 21A and FIG. 21B include images showing a three-dimensional photodetector according to an embodiment of the present disclosure in which a laser beam is incident at various angles of incidence.
Figure 21B:
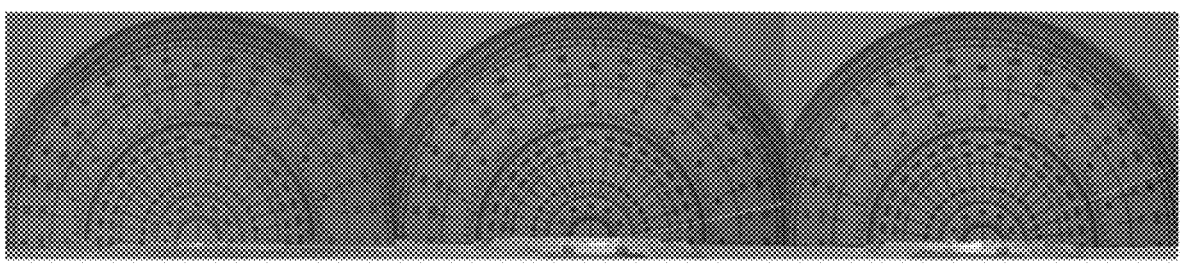

FIG. 21A and FIG. 21B include images showing a three-dimensional photodetector according to an embodiment of the present disclosure in which a laser beam is incident at various angles of incidence.

Referring to FIG. 21A, a laser beam is incident on the three-dimensional photodetector according to an embodiment of the present disclosure at an incidence angle of 45°, 90°, and 45°. Referring to FIG. 21B, a laser beam is incident on the three-dimensional photodetector according to an embodiment of the present disclosure at an incidence angle of 90°, 67.5°, and 0°.

Figure 22:
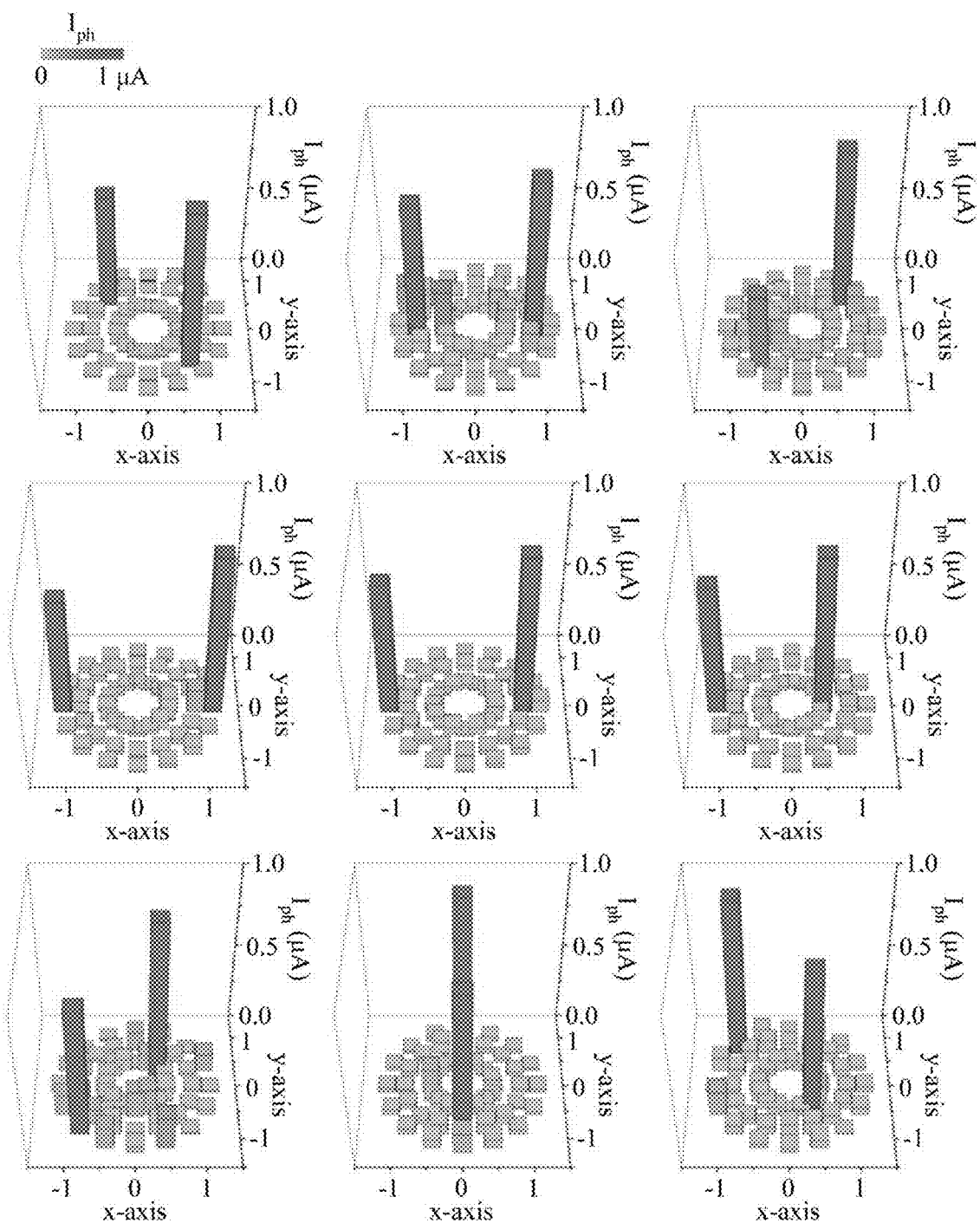
FIG. 22 includes graphs showing the photocurrent maps of a three-dimensional photodetector according to an embodiment of the present disclosure.

FIG. 22 includes graphs showing the photocurrent maps of a three-dimensional photodetector according to an embodiment of the present disclosure.

Referring to FIG. 22, it can be seen that the coordinates calculated based on values measured using the three-dimensional photodetector according to an embodiment of the present disclosure coincide with the coordinates measured with a protractor in FIGS. 21a and 21b.

The measured value may be a polar angle ($\varphi$) and an azimuth angle ($\theta$) between the x-y plane and the z direction.

FIG. 23A is a schematic diagram showing that a three-dimensional photodetector according to an embodiment of Referring to FIG. 24 and Table 2, it can be seen that deviations are reduced more in the high density array than in the low density array, and as distance between photoresistors decreases, the position identification accuracy of a laser beam increases.

Figure 25:
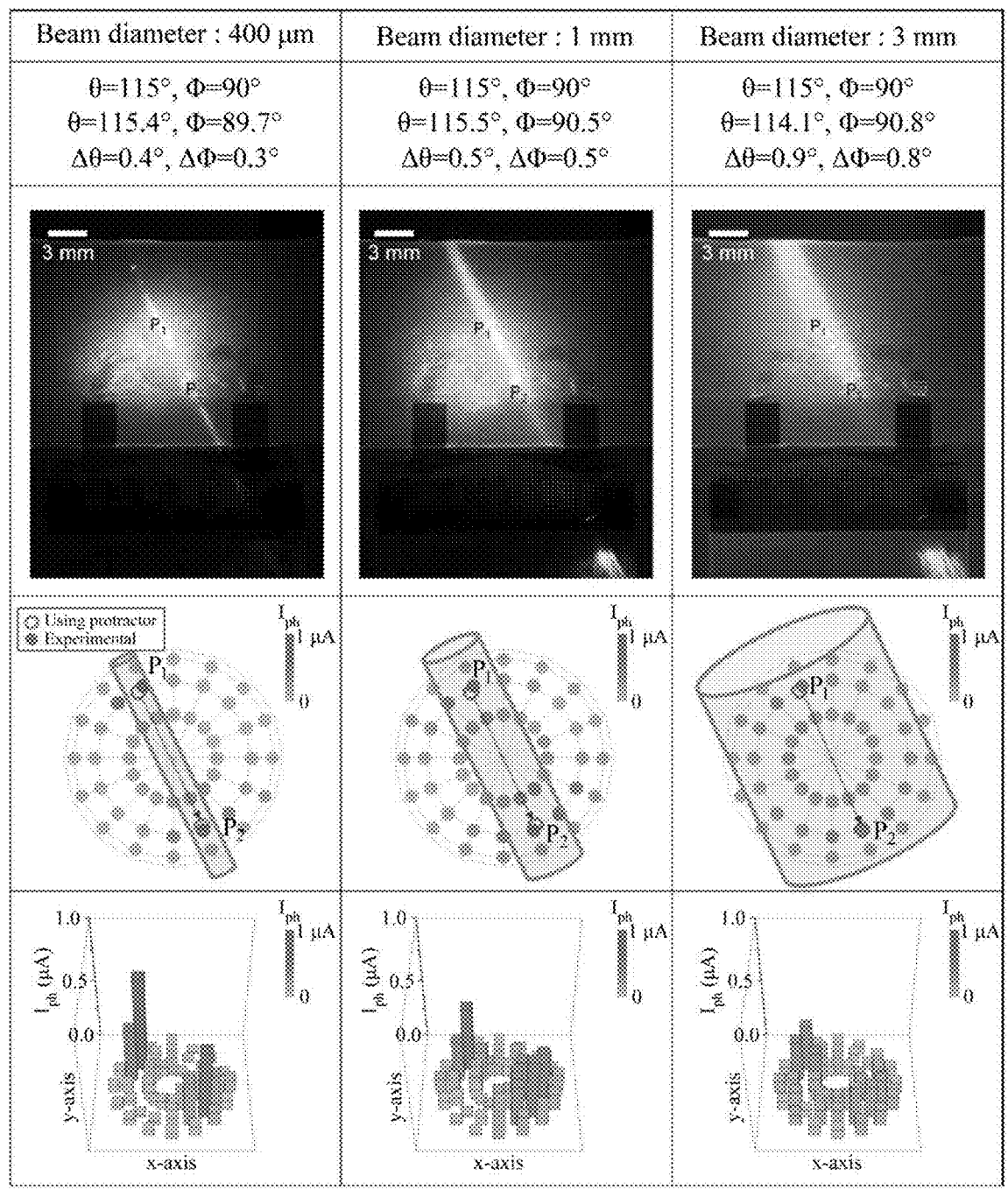
FIG. 25 includes images showing results of measuring the accuracy of a three-dimensional photodetector according to an embodiment of the present disclosure according to the diameter of a laser beam.

FIG. 25 includes images showing results of measuring the accuracy of a three-dimensional photodetector according to an embodiment of the present disclosure according to the diameter of a laser beam.

In FIG. 25, the incident point of a laser beam was measured without changing the position of the laser and the position of the three-dimensional photodetector according to an embodiment of the present disclosure, and the incident point was measured while adjusting laser beam diameter to calculate deviation between a measured incident position and an actual incident position.

Referring to FIG. 25, it can be seen that, as the diameter of a laser beam irradiated to the three-dimensional photodetector according to an embodiment of the present disclosure increases, photoresponse decreases (see the bar graph), indicating that, as the diameter of a laser beam increases, the size of a laser spot increases and, as a result, deviation increases.

Figure 26:
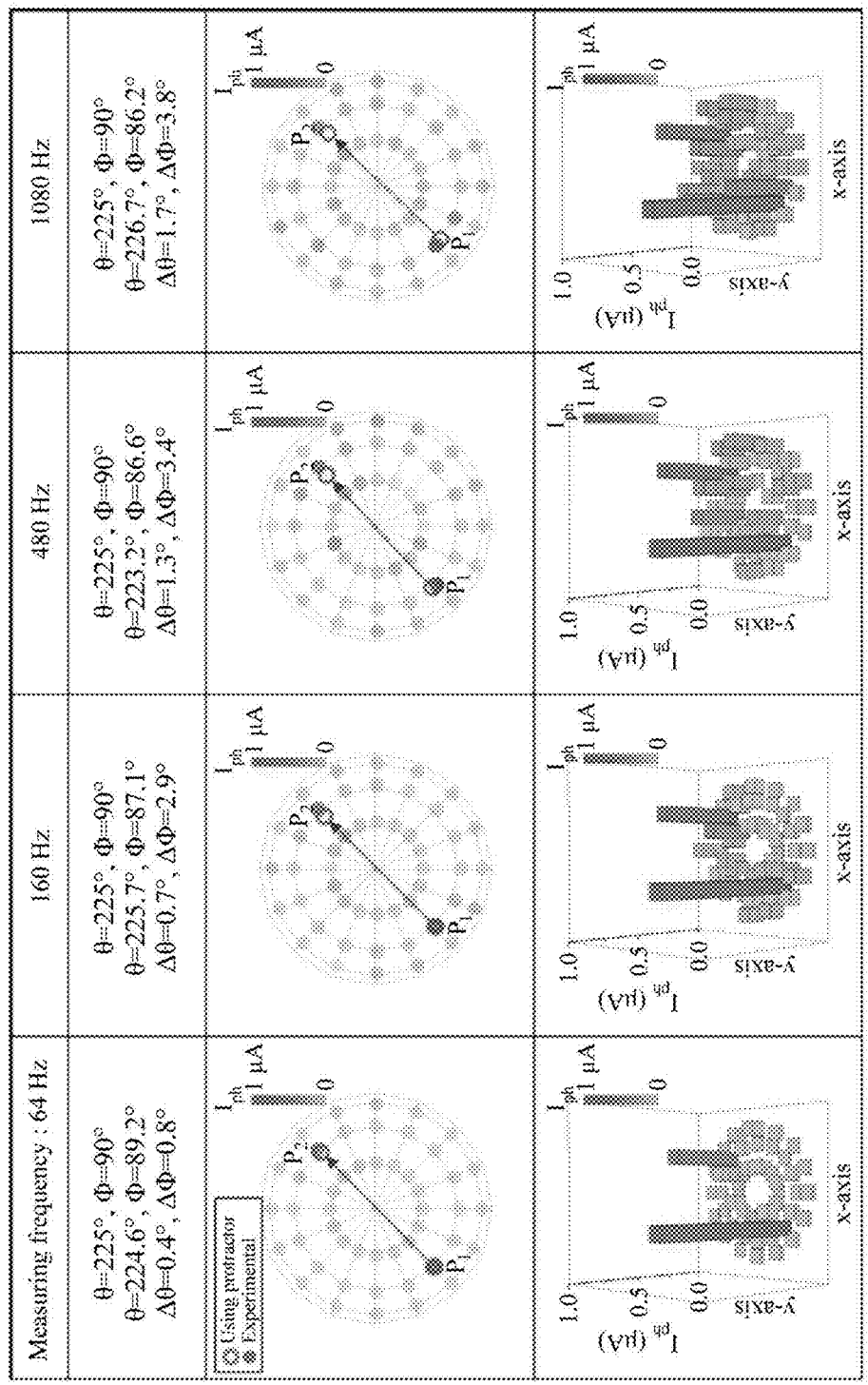
FIG. 26 includes images showing results of measuring the accuracy of a three-dimensional photodetector according to an embodiment of the present disclosure using high frequency waves.

FIG. 26 includes images showing results of measuring the accuracy of a three-dimensional photodetector according to an embodiment of the present disclosure using high frequency waves.

In FIG. 26, the incident point of a laser beam was measured without changing the position of the laser and the position of the three-dimensional photodetector according to an embodiment of the present disclosure, and the incident point was measured while adjusting frequency to calculate deviation between a measured incident position and an actual incident position.

Referring to FIG. 26, the positions of an incident laser beam in an incident area P1 and an exit area P2 of the three-dimensional photodetector according to an embodiment of the present disclosure were measured through photoresponse (see the bar graph) depending on frequency. It can be seen that the measured deviation increases slightly as frequency increases, but the positions of an incident laser beam in the incident area P1 and the exit area P2 are easily identified in a kHz range.

Figure 27A:
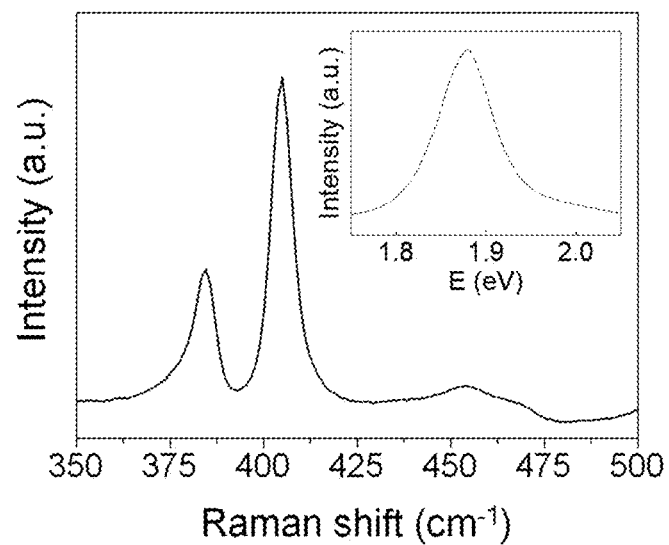
FIG. 27A is a graph showing the Raman spectrum of single layer molybdenum disulfide ($MoS_2$) grown using a chemical vapor deposition (CVD) method.
Figure 27B:
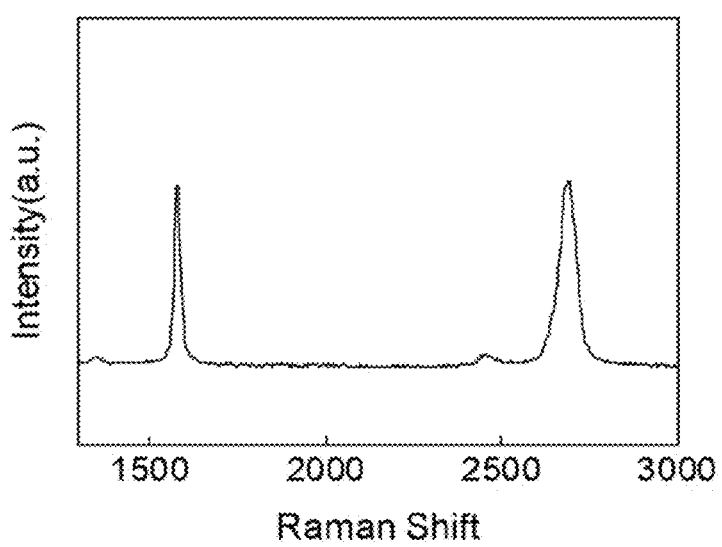
FIG. 27B is a graph showing the Raman spectrum of bilayer graphene.

FIG. 27A is a graph showing the Raman spectrum of single layer molybdenum disulfide ($MoS_2$) grown using a chemical vapor deposition (CVD) method, and FIG. 27B is a graph showing the Raman spectrum of bilayer graphene.

Referring to FIGS. 27A and 27B, it can be seen that molybdenum disulfide ($MoS_2$) used as the two-dimensional transition metal chalcogen compound channel of the photoresistor included in the three-dimensional photodetector according to an embodiment of the present disclosure is well formed as a single layer, and graphene used as the electrode of the photoresistor included in the three-dimensional photodetector according to an embodiment of the present disclosure is formed in a bilayer.

According to embodiments of the present disclosure, a three-dimensional photodetector that includes at least one photoresistor and is capable of tracking the traveling direction of light can be manufactured.

According to embodiments of the present disclosure, at least one photoresistor manufactured using a two-dimensional transition metal chalcogen compound and graphene is included in a three-dimensional photodetector, thereby improving the stability of the three-dimensional photodetector to external strain.

According to embodiments of the present disclosure, a three-dimensional photodetector can be easily manufactured by self-assembling a two-dimensional photodetection structure into a three-dimensional structure using a stretchable substrate.

According to embodiments of the present disclosure, at least one photoresistor can be manufactured using a two-dimensional transition metal chalcogen compound and graphene through a conventional photolithography process.

Although the present disclosure has been described through limited examples and figures, the present disclosure is not intended to be limited to the examples. Those skilled in the art will appreciate that various modifications, additions, and substitutions are possible, without departing from the scope and spirit of the invention.

Therefore, it should be understood that there is no intent to limit the invention to the embodiments disclosed herein, rather, the invention is to cover all modifications, equivalents, and alternatives falling within the spirit and scope of the invention as defined by the claims.

DESCRIPTION OF SYMBOLS

110: BASE PART
121: FIRST BENDING PART
122: SECOND BENDING PARTS
130: AT LEAST ONE BRANCH PART
140: BONDING PARTS
210: FIRST BASE MATERIAL
221: FIRST ELECTRODE
222: SECOND ELECTRODE
230: TWO-DIMENSIONAL TRANSITION METAL CHALCOGEN COMPOUND CHANNEL
240: SECOND BASE MATERIAL

What is claimed is:

1. A three-dimensional photodetector, comprising:
a base part formed in a center region of the three-dimensional photodetector;
a first bending part formed around the base part;
at least one branch part connected to the base part through the first bending part;
second bending parts formed on the at least one branch part;
bonding parts connected to the at least one branch part through the second bending parts;
at least one photoresistor formed on a surface of at least one of the base part and the branch parts; and
a stretchable substrate to which the bonding parts are attached,
wherein the bonding parts are attached to the stretchable substrate so that the base part has a gap in a thickness direction of the stretchable substrate; and
the at least one photoresistor is responsible for tracking a traveling direction of light.

2. The three-dimensional photodetector according to claim 1, wherein the at least one photoresistor tracks a traveling direction of incident light by detecting an entry point through which the incident light enters the three-dimensional photodetector and an exit point through which the incident light exits the three-dimensional photodetector.

3. The three-dimensional photodetector according to claim 1, wherein the three-dimensional photodetector detects a divergence angle of light.

4. The three-dimensional photodetector according to claim 1, wherein the three-dimensional photodetector detects intensity of light.

5. The three-dimensional photodetector according to claim 1, wherein the photoresistor comprises:
a first electrode and a second electrode, which are formed on a first base material and spaced apart from each other;
a two-dimensional transition metal chalcogen compound (2D transition metal dichalcogenides) channel formed on the first base material and disposed between the first electrode and the second electrode; and
a second base material formed on the first base material on which the first electrode, the second electrode, and the two-dimensional transition metal chalcogen compound channel are formed.

6. The three-dimensional photodetector according to claim 5, wherein the photoresistor further comprises a first protective layer formed on a surface of the first base material on which the two-dimensional transition metal chalcogen compound channel is formed.

7. The three-dimensional photodetector according to claim 5, wherein the photoresistor further comprises a second protective layer formed on a surface of the second base material in contact with the two-dimensional transition metal chalcogen compound channel.

8. The three-dimensional photodetector according to claim 5, wherein the two-dimensional transition metal chalcogen compound channel comprises at least one of molybdenum disulfide ($MoS_2$), molybdenum diselenide ($MoSe_2$), tungsten disulfide ($WS_2$), tungsten diselenide ($WSe_2$), tungsten ditelluride ($WTe_2$), molybdenum ditelluride ($MoTe_2$), tin diselenide ($SnSe_2$), zirconium disulfide ($ZrS_2$), zirconium diselenide (ZrSe$_2$), hafnium disulfide (HfS$_2$), hafnium diselenide (HfSe$_2$), niobium diselenide (NbSe$_2$), and rhenium diselenide (ReSe$_2$).

9. The three-dimensional photodetector according to claim 5, wherein the first electrode or the second electrode comprises graphene.

10. The three-dimensional photodetector according to claim 5, wherein the first base material or the second base material is formed of a transparent polymer.

11. The three-dimensional photodetector according to claim 5, wherein the first protective layer or the second protective layer comprises at least one of aluminum oxide (Al$_2$O$_3$), silicon oxide (SiO$_2$), silicon oxynitride (SiON), hafnium oxide (HfOx), zirconium oxide (ZrO$_2$), magnesium oxide (MgO), titanium oxide (TiO$_2$), zinc oxide (ZnO), tungsten oxide (WO$_3$), tantalum oxide (Ta$_2$O$_5$), niobium oxide (Nb$_2$O$_5$), yttrium oxide (Y$_2$O$_3$), cerium oxide (CeO$_2$), lanthanum oxide (La$_2$O$_3$), erbium oxide (Er$_2$O$_3$), hafnium aluminum oxide (HfAlO), hafnium silicon oxide (HfSiO), zirconium silicon oxide (ZrSiO), zirconium aluminum oxide (ZrAlO), hafnium oxynitride (HfON), hafnium silicon oxynitride (HfSiON), silicon nitride (SiN$_x$), silicon boron nitride (SiBN), and hexagonal-boron nitride (h-BN).

12. The three-dimensional photodetector according to claim 1, wherein the photoresistor comprises:
 a first electrode and a second electrode, which are formed on a first base material and spaced apart from each other;
 a p-type two-dimensional transition metal chalcogen compound and an n-type two-dimensional transition metal chalcogen compound, which are formed on the first base material and disposed between the first electrode and the second electrode; and
 a second base material formed on the first base material on which the first electrode, the second electrode, the p-type two-dimensional transition metal chalcogen compound, and the n-type two-dimensional transition metal chalcogen compound are formed.

13. The three-dimensional photodetector according to claim 12, wherein the photoresistor has a hetero P-N junction structure or a homo P-N junction structure.

14. The three-dimensional photodetector according to claim 1, wherein a thickness of the first bending part and a thickness of the second bending part are each thinner than a thickness of the base part or a thickness of the at least one branch part.

15. A method of manufacturing a three-dimensional photodetector, comprising:
 coating a support substrate with a first base material;
 patterning the first base material so that the first base material corresponds to a base part, a first bending part, at least one branch part, second bending parts, and bonding parts;
 forming at least one photoresistor on a surface of at least one of the base part and the branch parts of the patterned first base material;
 forming a second base material on the patterned first base material comprising the at least one photoresistor;
 separating the support substrate from the first base material;
 forming opening portions on at least one of the first base material and the second base material, which correspond to the first bending part and the second bending parts, and obtaining a two-dimensional photodetection structure;
 stretching a stretchable substrate so that the stretchable substrate is in a stretched state;
 attaching the two-dimensional photodetection structure to the stretchable substrate in a stretched state;
 weakening a bonding force between the stretchable substrate and the base part and a bonding force between the stretchable substrate and the branch parts; and
 releasing the stretched state of the stretchable substrate to self-assemble the two-dimensional photodetection structure into a three-dimensional structure.

16. The method according to claim 15, wherein the forming of at least one photoresistor comprises:
 forming a first electrode and a second electrode on a surface of at least one of the base part and the branch parts of the patterned first base material, so that the first and second electrodes are spaced apart from each other;
 forming a two-dimensional transition metal chalcogen compound channel on a surface of at least one of the base part and the branch parts of the patterned first base material, wherein the two-dimensional transition metal chalcogen compound channel is disposed between the first electrode and the second electrode; and
 forming the second base material on the patterned first base material on which the first electrode, the second electrode, and the two-dimensional transition metal chalcogen compound channel are formed.

17. The method according to claim 16, wherein the forming of at least one photoresistor further comprises forming a first protective layer on the patterned first base material.

18. The method according to claim 16, wherein the forming of the second base material further comprises forming a second protective layer on the patterned first base material on which the first electrode, the second electrode, and the two-dimensional transition metal chalcogen compound channel are formed.

19. The method according to claim 15, wherein the forming of opening portions on at least one of the first base material and the second base material and the obtaining of a two-dimensional photodetection structure further comprise applying photoresists (PRs) to the opening portions.

20. The method according to claim 16, wherein the forming of opening portions on at least one of the first base material and the second base material and the obtaining of a two-dimensional photodetection structure further comprise forming photoresists on a surface of the two-dimensional photodetection structure, which corresponds to at least one of the base part, the first bending part, the branch parts, and the second bending parts of the two-dimensional photodetection structure.

21. The method according to claim 15, wherein the obtaining of a two-dimensional photodetection structure further comprises performing first ultraviolet light/ozone (UV/O$_3$) treatment on the two-dimensional photodetection structure.

22. The method according to claim 15, wherein the stretching of a stretchable substrate further comprises performing second ultraviolet light/ozone (UV/O$_3$) treatment on the stretchable substrate.

* * * * *